United States Patent [19]
Sato et al.

[11] Patent Number: 4,961,166
[45] Date of Patent: Oct. 2, 1990

[54] DYNAMIC RAM HAVING A FULL SIZE DUMMY CELL

[75] Inventors: Katsuyuki Sato, Kodaira; Kazumasa Yanagisawa, Kokubunji; Kunio Ono, Fucyu, all of Japan

[73] Assignee: Hitachi, Ltd., Tokyo, Japan

[21] Appl. No.: 729,859

[22] Filed: May 2, 1985

[30] Foreign Application Priority Data

May 7, 1984 [JP] Japan .................................. 59-89407
Mar. 18, 1985 [JP] Japan .................................. 60-52228

[51] Int. Cl.$^5$ ...................... G11C 7/00; G11C 11/404
[52] U.S. Cl. .............................. 365/189.01; 365/207; 365/208; 365/210
[58] Field of Search ............... 365/189, 202, 210, 203, 365/207, 208

[56] References Cited

U.S. PATENT DOCUMENTS

| | | | |
|---|---|---|---|
| 4,351,034 | 9/1982 | Eaton, Jr. et al. | 365/203 X |
| 4,363,111 | 12/1982 | Heightley et al. | 365/210 |
| 4,443,868 | 4/1984 | Takemae | 365/203 X |
| 4,551,820 | 11/1985 | Matsuura | 365/189 |
| 4,559,619 | 12/1985 | Ikeda | 365/203 X |
| 4,602,355 | 7/1986 | Watanabe | 365/203 X |

FOREIGN PATENT DOCUMENTS 0049630 10/1981 European Pat. Off. .

OTHER PUBLICATIONS

"Storage Array and Sense/Refresh Circuit for Single-Transistor Memory Cells", by Karl U. Stein et al., appearing in the IEEE Journal of Solid State Circuits, vol. SC-7, No. 5, Oct. 1972, pp. 336-340.

*Primary Examiner*—Joseph A. Popek
*Assistant Examiner*—Alyssa H. Bowler
*Attorney, Agent, or Firm*—Antonelli, Terry, Stout & Kraus

[57] ABSTRACT

A dynamic RAM, in which the difference between a data signal level from one of a pair of complementary data lines coupled to a memory cell and a reference potential level of the other of the complementary data lines is differentially amplified by a sense amplifier. The data line taking the reference potential level is coupled to the other data line through a switch element so that its data line capacitance is increased. As a result, the reference potential level is held at a relatively stable level irrespective of a leakage current such as that caused by α particles. This construction makes it possible to use a full-size dummy cell because the capacitance of the data lines which takes the reference potential level is increased. The reference potential level achieved by the use of the full-size dummy cell is made relatively accurate because of the relative accuracy between the capacitances of the memory cells and the capacitance of the full-size dummy cell.

13 Claims, 8 Drawing Sheets

DYNAMIC RAM HAVING A FULL SIZE DUMMY CELL

BACKGROUND OF THE INVENTION

The present invention relates to a dynamic RAM, i.e., a dynamic type random access memory and, more particularly, to a technique in which a reading reference voltage is generated by a full-size dummy cell.

A 1-bit memory cell in a dynamic RAM is composed, for example, of a data memory capacitor and an address selecting insulated gate field effect transistor (which will shortly be called a "MOSFET") and is stored with a data of logic values "1" and "0" in a form of whether or not the capacitor is charged. The readout of the data is conducted by turning on the address selecting MOSFET to couple the data holding capacitor to a bit or data line and by sensing how the data line has its potential changing with the quantity of the charge stored in the capacitor.

In the RAM of recent years having a high integration and a large capacity, each memory cell has its size reduced, and a large number of memory cells are coupled to each data line. In accordance with this, the relationship between the capacitance Cs of the capacitor and a stray capacitance (i.e., a data line capacitance) Co of the data line, i.e., the ratio of Cs/Co takes a very small value so that the data signal to be fed from the memory cells to the data line, namely, the potential change to be applied to the data line in accordance with the quantity of the charge stored in the capacitor Cs has a very small value.

In order to make it possible to detect the small data signal, a differential sense technique or a balanced sense technique is utilized, as is disclosed, for example, in the specification of U.S. Pat. No. 4,061,954 (Ref. 1), in IEEE JOURNAL OF SOLID-STATE CIRCUITS, Vol. SC-7, No. 5, October, 1972, pp. 336 to 340 (Ref. 2) or ISSCC 84, DIGEST OF TECHNICAL PAPERS pp. 276 to 277 (Ref. 3).

In accordance with the technique disclosed above, the two data, bit or digit lines are paired, and there is coupled to the paired data lines (which will be called "complementary data lines", too) a sense amplifier which is constructed of a symmetric latch circuit for substantially conducting a differential or balanced amplification. One of the paired data lines is fed with the data signal from the memory cell, and the other is supplied with a reference potential which has an intermediate level between the high and low levels of the data signal. The reference potential is generated by the method (Ref. 1) using such a dummy cell (which will be called a "half-size dummy cell") as is made to have a capacitance half as large as that of the memory cell, by the method (Ref. 2) using such a dummy cell (which will be called a "full-size dummy cell") which has a capacitance substantially equal to that of the memory cell and as has its capacitor supplied in advance with a charge half as large as that of the memory cell, or by the precharge method (Ref. 3) (which will be called a "half-precharge method or dummy-cellless method") using a pre-short-operation between the respective data lines. The small signal level difference, which is established between the paired data lines on the basis of that reference potential, is amplified by the operation of the sense amplifier.

The reference potential has to be set at a desired level so that it enable the desired sensing operation.

Here, the half-size dummy cell is to be used, the margin of the sensing operation is highly influenced by the relative accuracy between the capacitors of the dummy cell and the memory cell. In general, the dummy cell is made under the same fabricating conditions and with the same design constants as those of the memory cell except that its capacitor has a capacitance substantially half as large as that of the capacitor of the memory cell, so that the relative accuracy between its capacitor and the capacitor of the memory cell may be enhanced.

In the dynamic RAM having a high memory capacity such as 1 mega bit, however, it becomes very difficult to fabricate a dummy cell having a half size because of the requisite small size of the data storing capacitors. In other words, the limitation and dispersion of the working accuracy of the element pattern make it difficult to fabricate the capacitor which has a capacitance substantially half as large as that of the capacitor of the memory cell.

In case the half-size dummy cell is to be used, therefore, it becomes difficult to establish the reference potential at the desired level.

In the system using the full-size dummy cell and the dummy-cellless system, on the contrary, it is possible to prepare a reference potential at a relatively accurate level. Thus, when the full-size dummy cell is used, more specifically, the dummy cell and the memory cell can be made to have the capacitors of the same size so that their relative accuracy can be sufficiently enhanced despite the working accuracy and dispersion. In the case of the dummy-cellless system, the relative accuracy of the capacitors raises no direct problem because the system has no dummy cell.

However, we have found that a reduction in the operating margin of the circuit is frequently caused by the fluctuations in the supply voltage even in the dynamic RAM of the type in which the relative accuracy of the dummy cell raises no serious problem as in the full-size dummy cell system. We also have found that the reduction in the operating margin of the circuit is also caused by the undesired change in the data line potential due to α particles.

SUMMARY OF THE INVENTION

It is, therefore, an object of the present invention to provide a dynamic RAM which has stable operations.

Another object of the present invention is to provide a dynamic RAM which can attain a stable reference potential.

A further object of the present invention is to provide a dynamic RAM which is small in characteristic fluctuations caused by fabrication dispersions.

A further object of the present invention is to provide a dynamic RAM which has its operating margin less deteriorated by α particles.

A further object of the present invention is to provide a dynamic RAM which is suitable for a shared sense system.

The aforementioned and other objects and novel the features of the present invention will become apparent from the description of the specification and the drawings attached thereto.

Representatives of the embodiments to be disclosed herein will be briefly described in the following.

A switch MOSFET is so connected between a plurality of data lines of a memory array that either the stray capacitance of the data line to be supplied with a reference potential or the data line capacitance may be substantially twice as large as that of the data line to be fed with a data signal.

DESCRIPTION OF THE PREFERRED EMBODIMENTS

Figure 1:
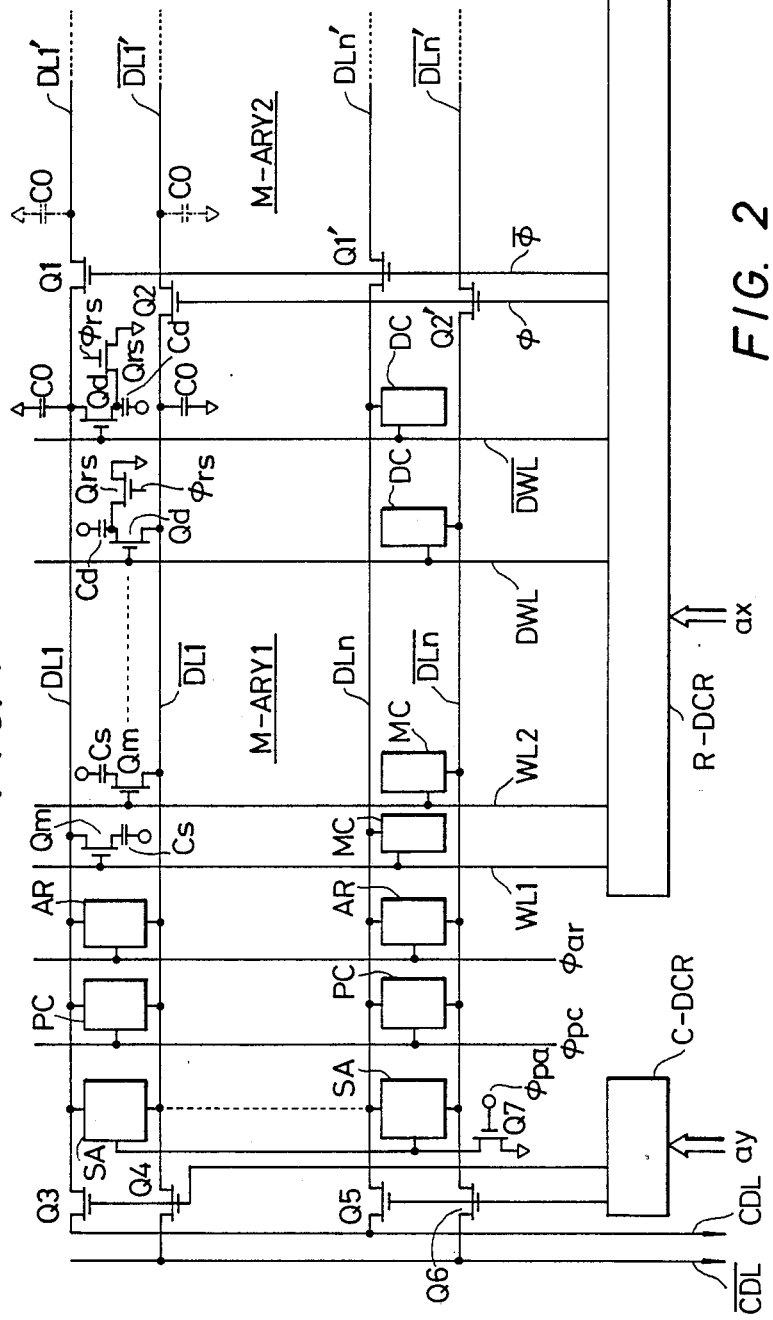
FIG. 1 a circuit diagram showing a dynamic RAM according to one embodiment of the present invention.

FIG. 1 is a circuit diagram showing a first embodiment of the present invention.

The circuit of the embodiment shown in FIG. 1 is composed mainly of IGFETs (i.e., Insulated Gate Field Effect Transistors) which are represented by N-channel MOSFETs.

A memory array M-ARY1 is composed of a plurality of data or bit lines DL1 and $\overline{DL1}$ to DLn and $\overline{DLn}$, a plurality of word lines WL1 to WL2, and a plurality of dynamic memory cells. Each memory cell MC has its selection terminal coupled to the corresponding word line and its data input/output terminal coupled to the corresponding data line. The memory array M-ARY1 is made of a folded bit line (or data line) construction. It follows that the data lines DL1 and $\overline{DL1}$ extending in parallel with and adjoining to each other are paired (which will be called "complementary data lines DL and $\overline{DL}$"). Each memory cell is coupled to one of the two nodes which are formed by the intersection between the complementary data lines and the word lines.

Each data line has a stray capacitance or a data line capacitance Co which is fed from itself and the input/output terminal of each memory cell. The numbers of the memory cells, which are coupled to the complementary data lines DL and $\overline{DL}$, respectively, are made equal to each other so as to enhance the detection accuracy, as will be described hereinafter.

The 1-bit memory cell MC is composed, as shown, of the data memory capacitor Cs and an address selecting MOSFET Qm and is stored with the data of the logic values "1" and "0" in the form of whether the capacitor Cs is charged or not.

The readout of the data is conducted by turning on the MOSFET Qm to couple the capacitor Cs to the data line DL (or $\overline{DL}$) and by subsequently sensing how the potential of the data line DL (or $\overline{DL}$) has changed in accordance with the quantity of the charge stored in the capacitor Cs.

In a memory array of high integration and capacity, the memory cell MC is constructed with small size, and many memory cells are connected with the data lines DL and $\overline{DL}$, respectively. Accordingly, the ratio of the capacitance Cs to the stray capacitance Co of the data line DL, i.e., the ratio of Cs/Co takes on a very small value. As a result, the potential change, which is to be imparted to the data line DL in accordance with the quantity of the charge stored in the aforementioned capacitor Cs, namely, the data signal takes on a very small value.

In order to generate a reference potential for detecting small level data signal, there are provided dummy cells DC. In this embodiment, each of those dummy cells DC is composed of a switch MOSFET Qd, a capacitor Cd and a resetting MOSFET Qrs, which are fabricated under the same fabrication conditions and with the same design constants as those of the memory cells MC. Each dummy cell has its capacitor Cd stored on stand-by with the earth potential of the circuit by the resetting MOSFET Qrs. The reference voltage or potential is determined by the charge distribution between the capacitor Cd and the data lines.

A precharge circuit PC coupled to the complementary data lines DL and $\overline{DL}$ is rendered operative in advance in response to a timing signal $\phi_{pc}$ and is rendered inoperative in synchronism with an addressing start, i.e., the start of selection of the memory cell. In response to this, each of the complementary data lines is set before the addressing start at a precharge level which is substantially equal to the supply voltage of the circuit. The difference between the level of the data signal determined by the memory cell and the level of the reference potential determined by the dummy cell is brought into a desired state by setting the respective complementary data lines at precharge levels equal to each other.

One sense amplifier SA has its paired input/output nodes coupled to the complementary data lines DL and $\overline{DL}$ and amplifies the potential difference, which is given between the complementary data lines by the addressing, for the sense period which is determined by a timing signal (or a sense amplifier control signal) $\phi_{pa}$ (as will be described hereinafter).

Each memory cell MC is coupled between one word line WL and one of the paired complementary data lines. Here, if the level of one word line is changed, undesired potential fluctuations, which are noise, are coupled to the respective data lines through an undesired coupling capacitor between that word line and each data line. In the case of the folded bit line type memory array, however, each word line WL intersects with both the complementary data lines. As a result, noise components, which are imparted to the respective complementary data lines in accordance with the level changes of the word lines WL, become substantially equal to each other. The sense amplifier SA of differential type is substantially insensitive to such common mode noises. In the addressing, when one memory cell MC coupled to one of the paired complementary data lines DL and $\overline{DL}$ is selected, one of paired dummy word lines DWL and $\overline{DWL}$ is so selected that the dummy cell DC fails to be coupled to the other data line.

The sense amplifier SA is composed, although not shown in detail, of a pair of cross-connected MOSFETs having positive feedback actions, by which the minute signals appearing on the complementary data lines DL and $\overline{DL}$ are differentially amplified. Those positive feedback actions are started when a MOSFET Q7 is turned on by the timing signal $\phi_{pa}$. In this case, it is desired that the MOSFET Q7 is composed of two parallel-connected MOSFETs so that the following two-stage amplifications may be conducted. Thus the MOSFET Q7 is replaced by a MOSFET which is made to have a relatively small conductance when it is rendered conductive and a MOSFET which is made to have a relatively large conductance. The operations of the sense amplifier SA are started as the MOSFET having the characteristics of the relatively small conductance is started to become conductive by a relative early timing signal. In accordance with this, the higher and lower potentials of the data lines, which have been determined in advance on the basis of the difference of the potentials applied in advance to the complementary data lines DL and $\overline{DL}$ by the addressing, are dropped at a lower and higher speeds, respectively, while widening the difference in-between. Moreover, when the voltage difference is enlarged to a considerable value, the MOSFET, which is caused to have characteristics of a relatively large conductance, is rendered conductive by a delayed timing signal. As a result, the lower potential of the data line is abruptly dropped. By conducting the operations of the sense amplifier SA separately at the two stages, the aforementioned higher potential can be prevented from being drastically dropped. When the lower potential is dropped to a lower level than the threshold voltage of the cross-coupled MOSFET, the positive feedback operation is ended, and the drop of the higher potential is held at a relatively high potential equal to the value which is set by subtracting the threshold voltage of the MOSFET from a supply voltage Vcc, until the lower potential arrives at the earth potential (at 0 V).

Upon the addressing, the stored data of the memory cell MS, which would have been lost, are recovered as a result of the potential at the high or low level generated by that sensing operation being received as it is by the, memory cell MC. Once the high level drops more than a predetermined extent with respect to the supply voltage Vcc, as has been described above, however, several repetitions of the read and rewrite will cause an erroneous operation of misreading the high level as the logic value "0". In order to prevent this erroneous operation, therefore, each complementary data line is equipped with an active restore circuit AR. This active restore circuit AR is operated in response to a timing signal $\phi_{ar}$ and responds to the high-level signal without adversely affecting the low-level signal to selectively boost it to the potential of the supply voltage Vcc.

The complementary data lines DL and $\overline{DL}$ are connected with common complementary data lines CDL and $\overline{CDL}$ through MOSFETs Q3 and Q4 constructing a column switch CW. The remaining data lines are connected with the common complementary data lines CDL and $\overline{CDL}$ through similar MOSFETs Q5 and Q6.

The circuits thus far described constitute the memory array M-ARY1. At the righthand side of the same Figure, there is also arranged a memory array M-ARY2 which is symmetrically similar to that memory array M-ARY1.

In order that a read reference potential Vref at an intermediate potential between the read high and low levels may be generated by the full-size dummy cell DC, according to the present embodiment, switch MOSFETs Q1 and Q2 (or Q1' and Q2') are connected between the corresponding data lines of the memory arrays M-ARY1 and M-ARY2. These MOSFETs Q1 and Q1', and Q2 and Q2' have their gates fed commonly with timing signals $\phi$ and $\overline{\phi}$ which will be described hereinafter.

Either the common complementary data lines CDL and $\overline{CDL}$ corresponding to the memory array M-ARY1 or the common complementary data lines (not shown) corresponding to the memory array M-ARY2 are selected in response to a column address signal and are connected with output terminals of a data write circuit (not illustrated) and with input terminals of a data output circuit.

A row decoder R-DCR and a column decoder C-DCR receive internal complementary address signals ax and ay which are generated by an address buffer (not illustrated), and generate selecting signals and column switch selecting signals for selecting one word line, one dummy word line and the aforementioned switch MOSFET Q1 or Q2 to address the memory cells and the dummy cells. The address decoder R-DCR is so constructed to select the word line and dummy word line of one of the two memory arrays M-ARY1 and M-ARY2 in response to the internal complementary address signals ax.

Here, the selecting signals for selecting the dummy word lines, the selecting signals or timing signals $\phi$ and $\overline{\phi}$ for the switch control of the MOSFETs Q1 and Q2 are generated by the following method, for example. The description of the detailed construction of the circuit for generating those signal will be omitted because it has no direct relationship to the present invention.

In the present embodiment, the internal complementary address signals ax to be fed to the row address decoder R-DCR are weighted to have one-to-one correspondence. In accordance with this, which of the word lines among the word lines of memory arrays M-ARY1 and M-ARY2 is to be selected is determined by the address signal of the most significant bit (which will be called an "array selecting address signal") of the address signals ax. Since the respective memory cells coupled to the word lines, respectively, are coupled with a regularity to the complementary data lines, respectively, moreover, which of the complementary data lines is to be fed with the data from the memory cells is determined in response to such a 1- or 2-bit address signal of the address signals as has the least significant bit or the least significant bit and a high-order bit. In accordance with this, which of the dummy cells coupled to the complementary data lines, respectively, is to be operated is determined in response to the 1 or 2-bit address signal (which will be called a "dummy word selecting address signal").

As a result, by combining a suitable timing signal such as the word line selecting timing signal, the array selecting signal and the dummy word selecting address signal, it is possible to generate the selecting signal to be fed to the four dummy word lines of the two memory arrays.

One of the timing signals $\phi$ and $\overline{\phi}$ so selected such that a data line of the complementary data lines DL and $\overline{DL}$ of one memory array as is to be supplied with the reference potential by the dummy cells may be coupled to the data line of the other memory array. As a result, the timing signals $\phi$ and $\overline{\phi}$ can be generated by combining, for example, such a suitable timing signal which is rendered to the high level at selecting timing of the word line and the dummy word line and which is rendered to the low level at an operation timing of the sense amplifier, and the dummy word line selecting timing signal.

The operation of the dynamic RAM of the present embodiment will be described in the following.

When the word line WL1 of the memory array M-ARY1, for example, is to be selected, the word line WL1 is brought into a selected state, and the dummy word line DWL and the timing signal line φ are brought into their respective selected states of the-high level. At this time, the word line (not illustrated) and dummy word line of the other memory array M-ARY1 are not selected.

The memory cells are connected with the data line DL of the complementary data lines DL and $\overline{DL}$ by the selecting operation of the word line WL1, whereas the dummy cells DC are connected with the other line $\overline{DL}$ of the complementary data lines by the selecting operation of the dummy word line DWL. At the same time, the switch MOSFET Q2 at the side of the data line $\overline{DL}$, which is connected with the dummy cells DC, is rendered conductive by the timing signal φ.

Thus, the states of the word line WL1, the dummy word line DWL, and the data lines DL and $\overline{DL}$ when the timing signal φ is set at the selected level will be described in the following.

Figure 2:
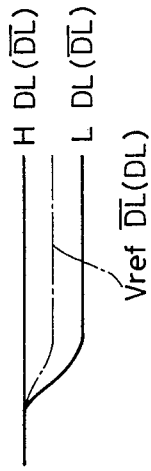
FIG. 2 is a chart showing the operating waveforms of the circuit of FIG. 1.

Specifically, the data line DL, to which the memory cell MC to be selected is coupled, is electrically isolated from the corresponding data line of the memory array M-ARY2 since the MOSFET Q1 is held to off state. As a result, the stray capacitance or the data line capacitance of the data line DL is left at the value Co. Accordingly, the quantity of the signal to be fed to the data line DL when the memory cell MC is selected is relatively large. FIG. 2 shows in a solid curve the waveform of the potential of the data line DL when the memory cell is selected.

The data line $\overline{DL}$, to which the dummy cell DC to be selected of the memory array M-ARY1 is coupled, is electrically coupled to the accordingly data line of the memory array M-ARY2 accordingly as the MOSFET Q2 is turned on. As a result, the stray capacitance of the data line $\overline{DL}$ corresponding to the dummy cell DC substantially takes the value of Co+Co, i.e., the value twice as large as the stray capacitance Co of the respective data lines.

Thus, the ratio of the capacitor of the dummy cell DC and the substantial capacitor of the data line $\overline{DL}$ becomes one half as large as that of the capacitor of the memory cell MC to the capacitor of the data line $\overline{DL}$. In other words, the ratio of the capacitor Cd of the full-size dummy cell to the substantial capacitor 2Co of the data line DL becomes substantially equal to that of the capacitor of the half-size dummy cell to the capacitor Co of one data line. As a result, the reference voltage Vref to be fed to the data line $\overline{DL}$ when the dummy cell DC is selected is set at a substantially intermediate level between the high and low levels of the data signal to be fed to the data line DL by the memory cell MC, as indicated in a single-dotted line in FIG. 2.

As has been described hereinbefore, prior to the addressing, the complementary data lines DL and $\overline{DL}$ are precharged to a predetermined level substantially equal to the supply voltage Vcc of the circuit as a result that the precharge circuit PC is operated by the precharging timing signal $\phi_{pc}$. When the word line WL2, for example, is to be selected, on the other hand, the dummy word line $\overline{DWL}$ and the timing signal line φ are brought into the selected states. Accordingly, the stray capacitance at the side of the data line DL is set at 2Co, and the reference voltage Vref is fed to the data line DL like the above operation.

The sense amplifier SA has its operation started at the time when the read data signal and the reference voltage Vref appear on the complementary data lines DL and $\overline{DL}$. Although not limited thereto, the switch MOSFET Q1 or Q2 is turned off in synchronism with the operation starting timing of the sense amplifier SA. Thus, the load capacitance coupled to the paired input-/output nodes of the sense amplifier SA are balanced, and the reference voltage Vref can be promptly drawn to the low level when the data of the high level are to be read. As a result, the aforementioned positive feedback amplification can be conducted at a high speed.

Figure 3:
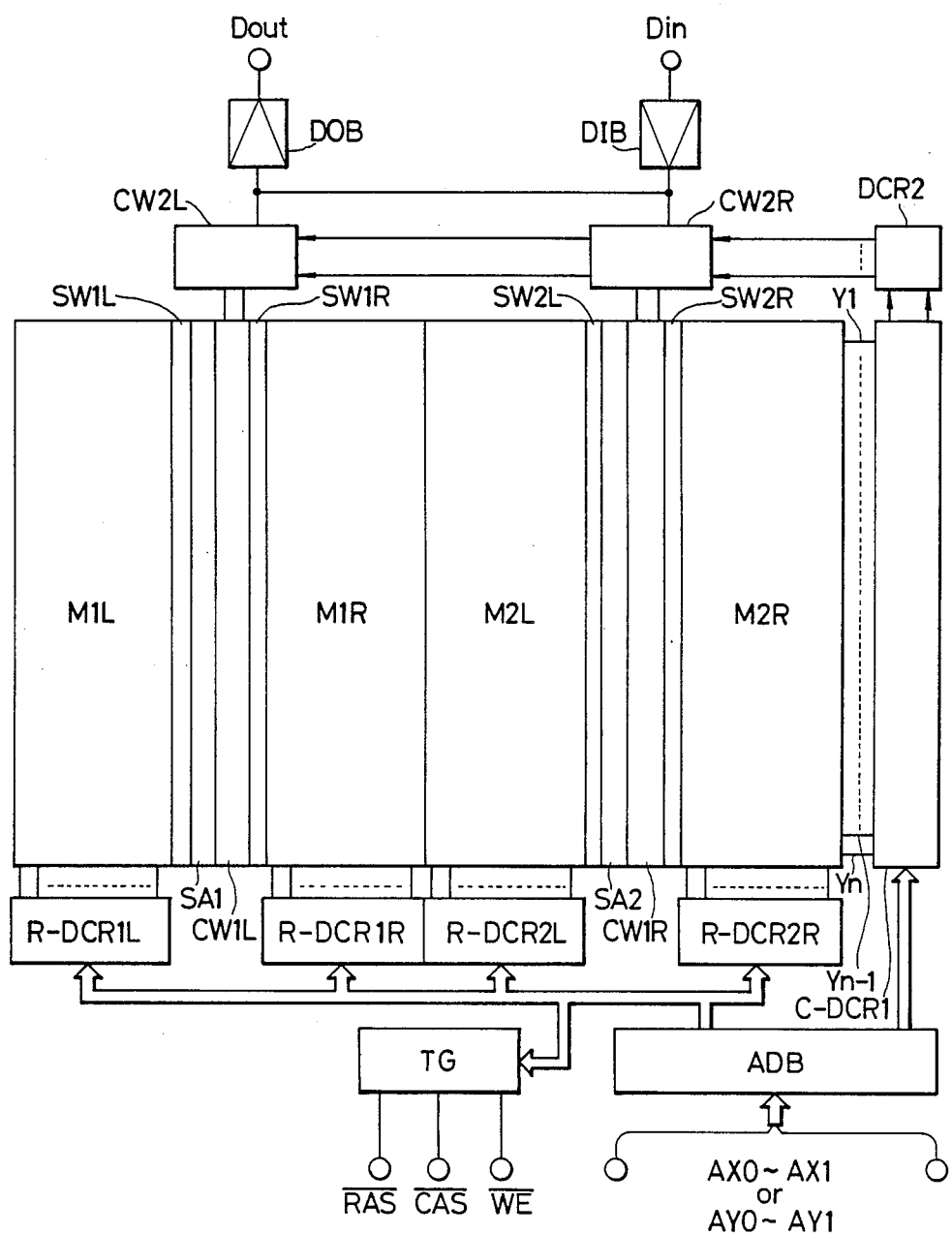
FIG. 3 is a block diagram showing a dynamic RAM according to a second embodiment.

FIG. 3 is a block diagram showing the dynamic RAM according to a second embodiment of the present invention. The respective major circuit blocks appearing in FIG. 3 are drawn generally in conformity with the actual geometric arrangement and are formed on a semiconductor substrate made of one single-crystal of silicon by the semiconductor integrated circuit technique, although not limited thereto.

Although not limited thereto, the present embodiment may be utilized for the dynamic RAM of shared sense type.

The various circuits constituting the RAM have their respective operations controlled in response to the various timing signals which are generated by a timing generator TG, as will become apparent from the later description. In FIG. 3, however, the signal lines to be provided for connecting the timing generator TG and the various circuits are omitted so that the drawing is not over complicated.

The dynamic RAM according to the present embodiment is constructed of four memory arrays M1L, M1R, M2L and M2R, although not limited thereto. Each of the memory arrays M1L and M2R is made of the folded bit line (or data line) construction, as will become apparent from the later description to be made with reference to FIGS. 4A and 4B. Therefore, each memory array is composed of a plurality of data lines to be paired, i.e., a plurality of complementary data lines, a plurality of dynamic memory cells to have their respective data input/output terminals coupled to the corresponding data lines, and a plurality of word lines to which the selecting terminals of the dynamic memory cells are respectively coupled. The data lines (not illustrated) are extended in the row direction of FIG. 3. The word lines are extended in the column direction of the same Figure.

The memory arrays M1L and M1R and the memory arrays M2L and M2R are paired, respectively.

In accordance with the present embodiment, the data lines of the paired respective memory arrays are made to have data line capacitances substantially equal to each other. In order to make the data line capacitances substantially equal, although not limited thereto, the memory arrays M1L and M1R have an identical construction, i.e., the data lines, memory cells and word lines are identical.

Between the paired memory arrays M1L and M1R, there is arranged a sense amplifier SA1 which is selectively utilized by those memory arrays. Between the memory array M1L and the sense amplifier SA1, there is arranged a switch circuit SW1L for selectively coupling them to each other. Between the memory array M1R and the sense amplifier SA1, there is likewise connected a switch circuit SW1R for selectively coupling them to each other.

Between the paired memory arrays M2L and M2R, there are also arranged a sense amplifier SA2 and switch circuits SW2L and SW2R.

The switch circuits SW1L to SW2R have their respective operations controlled by the timing signals which are outputted from the timing generator TG.

One of the two switch circuits SW1L and SW1R corresponding to one sense amplifier, e.g., the sense amplifier SA1 is basically turned off at the start of the access of the memories. According this, one of the paired memory arrays M1L and M1R is isolated from the sense amplifier SA1 whereas the other is left coupled to the, sense amplifier SA1. In other words, each pair of data lines of one memory array are isolated from, the sense amplifier SA1 whereas each pair of data lines of the other memory array are left coupled to the sense amplifier SA1. In accordance with the present embodiment, however, the timing, at which one of the paired data lines of one memory array is isolated from the sense amplifier SA1, is made different from that of the other, as will be described later in detail with reference to FIG. 6.

The sense amplifiers SA1 and SA2 have their respective operations controlled by the timing signals which are outputted from the timing generator TG. It should be understood that the sense amplifiers SA1 and SA2 presented as the circuit blocks of FIG. 3 contain the precharge circuit, full-size dummy cell, active restore circuit and so on, as will be described later in detail with reference to FIGS. 4A and 4B.

The RAM has an ,address circuit for selecting a desired memory cell from the plurality of memory cells and desired one from the plural dummy cells of each memory array. The address circuit is constructed of an address buffer ADB, row address decoders R-DCR1L to R-DCR2R, column address decoders C-DCR1 and C-DCR2, column switch circuits CW1L to CW2R and so on.

The respective circuits of the address circuit have their respective operations controlled by the timing signals which are generated from the timing generator TG.

To the external terminal of the RAM, to which the input terminal of the address buffer ADB is coupled, there are fed in a time-sharing manner external row address and column address signals in accordance with an address multiplex system.

When the timing signals for controlling the introduction of the address signals are generated in synchronism with generation of a row address strobe signal $\overline{RAS}$, the address buffer ADB takes the external row address signal in response to the generation of the timing signals. As a result, the internal complementary address signal of the row system, which is to be fed to the row address decoders R-DCR1L to R-DCR2R, is outputted from the address buffer ADB. The address buffer ADB takes in the external column address signal in response to the generation of a column address strobe signal $\overline{CAS}$ and outputs the internal complementary address signal of the column system, which is to be fed to the column address decoder C-DCR1.

The row address decoders R-DCR1L to R-DCR2R are arranged below the memory arrays M1L to M2R, as shown in FIG. 3, and have their respective output terminals coupled to the word lines of the corresponding memory arrays. These row address decoders R-DCR1L to R-DCR2R have their respective operations controlled by the word line selecting timing signal which is generated from the timing generator TG, and output word line selecting signals and the dummy word selecting signals in synchronism with the timing signal.

Thus, the word lines of the respective, memory arrays M1L, M1R, M2L and M2R are selected and as a result they are fed respectively with the word line selecting signals generated by the row address decoders R-DCR1L, R-DCR1R, R-DCR2L and R-DCR2R. In this case, by making the row address decoders R-DCR1L and R-DCR1R of suitable constructions,, all the word lines of the memory array M1R are not selected when one word line of the memory array M1L is paired with the memory array M1R whereas all the word lines of the memory array M1L are not selected when one word line of the memory array M1R is selected. By likewise making the row address decoders R-DCR2L and R-DCR2R of suitable constructions, the word lines of the memory arrays M2L and M2R of another pair are alternatively selected.

The column address decoder C-DCR1 has its operations controlled by either the data line selecting timing signal or column selecting timing signal which is outputted from the timing generator TG, and outputs the data line selecting signals or the column selecting signals in synchronism with the timing signal. Although not limited thereto, the column address decoder C-DCR1 is arranged at the righthand, side of the memory arrays, as shown. The output lines of the column address decoder C-DCR1 (not illustrated), i.e., the data selecting lines are extended over the memory arrays and coupled to the column switch circuits CW1L and CW1R. The column address decoder C-DCR1 is not shown in detail because it has no direct relationship with the present invention, but is composed of a plurality of unit circuits for respectively feeding outputs to the respective data line selecting lines.

The column switch circuits CW1L and CW1R are provided, respectively, between common data lines provided to correspond to the memory arrays M1L and M1R and the input/output terminals of the sense amplifier SA1 and between common data lines provided to correspond to the memory arrays M2L and M2R and the input/output terminals of the sense amplifier SA2, and are commonly fed with the data line selecting signals which are generated by the column address decoder C-DCR1. In response to the selecting signals which are generated by the column address decoder C-DCR1, specifically, the column switch circuits CW1L and CW1R respectively couple the input/output terminals of the sense amplifiers SA1 and SA2 to the common data lines which run in the column direction, although not shown.

Here, each of the unit circuits of the column address decoder C-DCR1 is caused to have a relatively large pitch when it is formed on the semiconductor substrate in accordance with the semiconductor integrated circuit technique. In accordance with the present embodiment, each of the column switch circuits CW1L and CW1R is constructed, as will become apparent later with reference to FIG. 4B, although not especially limitative thereto, while considering the possible pitch of the unit circuits constructing the column address decoder circuit C-DCR1, such that two pairs of complementary data lines adjacent to each other are coupled simultaneously with each other to two pairs of complementary common data lines in response to one data line selecting signal. As a result, each unit circuit of the column address decoder C-DCR1 has its pitch made coincident with that of the totally four data lines. In the case of this construction, the signals of four bits, i.e., the two-bit signal of the memory array M1L or M1R and the two-bit signal of the memory array M2L or M2R are simultaneously selected by the column selecting circuit which is constructed of the column address decoder C-DCR1 and the column switch circuits CW1L and CW1R. In order to select a one-bit signal from the 4-bit signal in the present embodiment, although not especially limitative thereto, the second column switch circuits CW2L and CW2R are provided between two pair of the common data lines corresponding to the memory arrays M1L and M1R, two pairs of the common data lines corresponding to the memory arrays M2L and M2R, the output terminal of a data input buffer D1B, and the input terminal of a data output buffer D0B. Those second column switch circuits CW2L and CW2R have their respective operations controlled by the selecting signals which are generated by a second column address decoder circuit DCR2. If the construction is made, as above, such that the reading and writing operations of the memory arrays are conducted by four bits, the conversions to the function of the data access by four bits or the data input and output in a nibble mode can be effected relatively simply by changing mainly the constructions of the second column switch circuit and the input/output circuit portion.

The data input buffer D1B has its operations controlled by a timing signal which is generated from the timing generator TG, and generates write signals, which correspond to write signals fed from an external terminal Din, to feed them to the second column switch circuit CW2L or CW2R. The data input buffer D1B exhibits high output impedance characteristics when it is held in its inoperative state.

The data output buffer D0B likewise has its operations controlled by a timing signal which is generated from the timing generator TG, and receives the read signals, which are outputted through the second column switch circuit CW2L or CW2R, to amplify and send out them to an external terminal Dout.

The timing generator TG for controlling the data read/write operations generates a variety of timing signals in response to the row address strobe signal $\overline{RAS}$, the column address strobe signal $\overline{CAS}$ and a write enable signal $\overline{WE}$ which are fed from the external terminals.

In accordance with the present embodiment, it is necessary to change the operation timings of the switch circuits SW1L to SW1R in response to the states of the row address signals, as will become apparent from the detailed later description made with reference with FIGS. 4A and 4B to FIG. 6. Therefore, the timing generator TG is made receptive of a part of the internal complementary address signals of the row system, which are outputted from the address buffer ADB.

The switch circuits SW1L and SW1R are made to have the operation, as will be schematically described in the following. The operation of the switch circuits SW2L and SW2R corresponding to the memory arrays M2L and M2R are made substantially the same as those of the switch circuits SW1L and SW1R. In the description to be made in the following, for convenience of description, one of the paired complementary data lines of the memory array M1L will be called a "first data line" whereas the other will be called a "second data line". Of the respective complementary data lines of the memory array M1R, on the other hand, the data line to correspond to the first data line will be called a "third data line" whereas the other data line will be called a "fourth data line".

Both the switch circuit SW1L and SW1R are held to the on state before the start of the access of the RAM, i.e., when the row address strobe signal $\overline{RAS}$ (which will be referred to as the "$\overline{RAS}$ signal") is at the high level. According with this, both of the first and third data lines and both of the second and fourth data lines are coupled, respectively, through the switch circuit SW1L, the input/output terminals of the sense amplifier SA and the switch circuit SW1R. The respective data line at this time are set at the precharge level.

When the $\overline{RAS}$ signal is dropped to the low level, the access of the RAM is started. Here, if the row address signal is held in the state to select one word line of the array M1L, of the paired memory arrays M1L and M1R, for example, the switch circuit SW1L corresponding to the memory array M1L is maintained in its ON state. In this case, the switch circuit SW1R is made to have the following operations.

If the row address signal indicates such that one of the plural memory cells of the memory array M1L is coupled to the first data line, the switch circuit SW1R is first switched before the start of the selection of the word lines of the memory array M1L to isolate the third data line of the memory array M1R from the input/output terminals of the sense amplifier SA1, and then switched after the start of the operations of the sense amplifier SA1 to isolate the fourth data line of the memory array M1R from the input/output terminals of the sense amplifier SA1. As a result, the third data line of the memory array M1R is isolated from the first data line before the start of the selection of the memory cells, whereas the fourth data line is isolated from the second data line after the start of the selection of the memory cells and the operations of the sense amplifier SA1.

One of the plural full-size dummy cells of the sense amplifier SA1 is coupled to the second data line selected in synchronism with the start of the selection of the word line. When the full-size dummy cell is selected, the second data line is coupled to the fourth data line so that it has a data line capacitance substantially twice as large as that of each data line capacitance. As a result, the reference potential to be applied to the second data line by the full-size dummy cells becomes equivalent to that which is applied to the data line by the half-size dummy cells.

In the case when the memory cells coupled to the to fourth data lines are to be selected, operations similar to the aforementioned ones are conducted.

As is apparent from the description made above, each of the switch circuits SW1L and SW1R requires two kinds of timing signals. The timing signals for those switch circuits can be generated by the following construction.

In each memory arrays, specifically, the plural memory cells and word lines are regularly arrayed. On the other hand, the row address decoders are usually so constructed as to regularly decode the row address signals. Specifically, the plural memory cells coupled to the first data line, for example, are coupled to the word lines of a regular discrete order, respectively, and the plural memory cells coupled to the second data line are likewise coupled to the word lines of a regular discrete order, respectively. Each word line is so ordered as to correspond to the order which is made by combining the row address signals. Therefore, whether or not one of the plural memory cells coupled to one data line is selected is determined by one or two bits of the row address signals (which will be called "dummy address signals"), e.g., either the least significant bit or the least significant bit and the next order bit.

Which of the paired memory arrays M1L and M1R is to be selected is determined by the level of one bit such as most significant bit of the row address signal (which will be called an "array selecting address signal").

Therefore, the timing signals for the switch circuits SW1L and SW1R can be generated by a logic circuit (not illustrated) which is made receptive of several delay (or timing) signals generated on the basis of the row address strobe signal $\overline{RAS}$, the dummy address signals and array selecting signals. However, the detailed internal construction per se of the circuit for generating those timing signals will be not described because it has no direct relationship with the present invention.

The dummy word line selecting signals to be fed to the dummy word lines coupled to the dummy cells can be generated on the basis of the dummy address signals and the word line selecting timing signals.

In accordance with the present embodiment, the data signal level to be fed to the first data line by the selected memory cell rises to a relatively large value because the first data line is isolated in advance from the third data line. The reference potential to be applied to the second data line is made accurate by the use of the full-size dummy cells. Undesired level change of the second data line due to α particles is sufficiently small because the second data line has a substantially twice data line capacitance. As a result, the satisfactory read operations can be conducted.

Figure 4A:
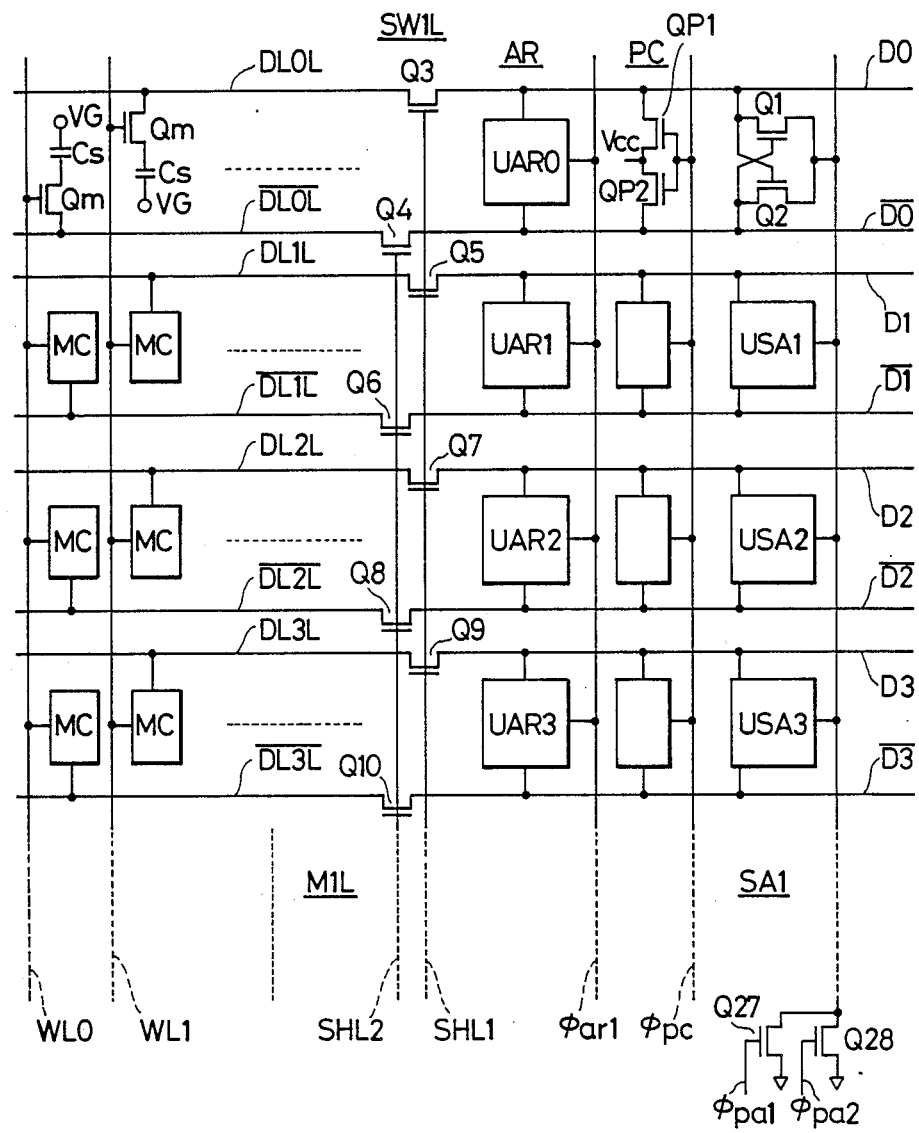
FIGS. 4A and 4B are specific circuit diagrams showing the blocks M1L, SW1L, PC, SA1, SW1L, SW1R and M1R of FIG. 3, respectively.
Figure 4B:
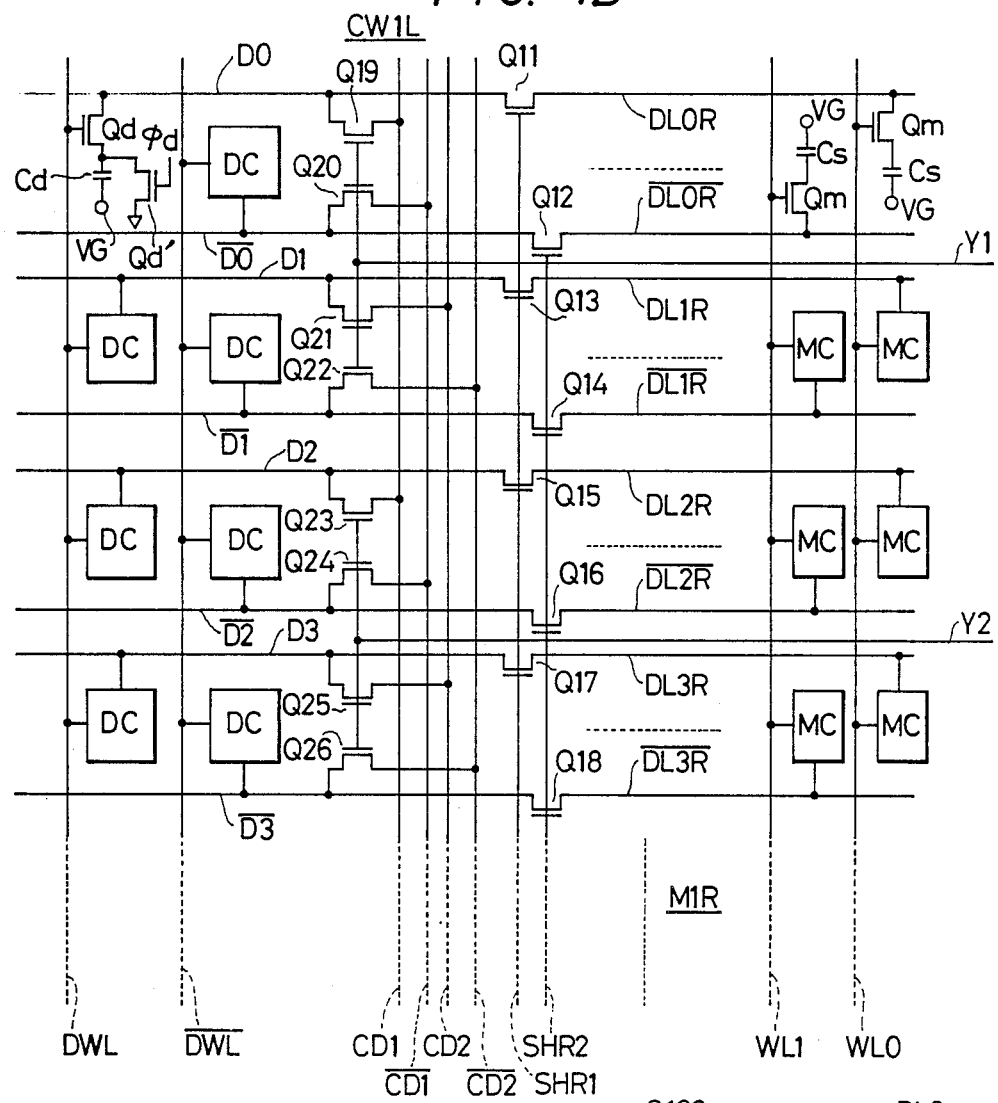
Figure 5:
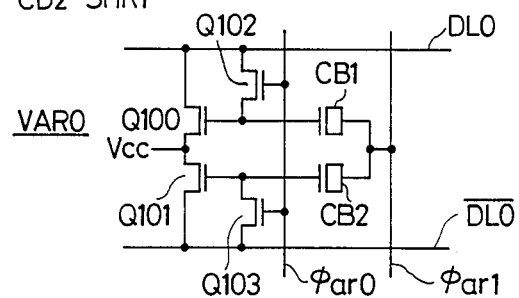
FIG. 5 is a specific circuit diagram of the block UARO of FIG. 4A.

FIGS. 4A and 4B are circuit diagrams showing one specific embodiment of the aforementioned memory arrays M1L and M1R and sense amplifier SA1.

The embodied circuit as shown is composed of IGFETs (i.e., Insulated Gate Field Effect Transistors) which are represented by N-channel MOSFETs.

The memory array M1L is composed of a plurality of complementary data lines DL0L and $\overline{DL0L}$ to DL3L and $\overline{DL3L}$, a plurality of word lines WL0 to WL1, and a plurality of dynamic memory cells MC. The memory array M1L is made of the folded bit line construction, as has been described hereinbefore. Therefore, the memory cell is arranged at one of the two intersections which are made by one pair of complementary data lines and one word line.

The memory array M1R is made to have a construction similar to that of the memory array M1L.

The sense amplifier SA1 is constructed of a plurality of unit circuits each of which is composed of the amplifying MOSFETs Q1 and Q2 in the latch form. This sense amplifier SA1 enlarges the small difference of the potential change, which is given to each complementary data lines during the addressing, to the sense period which is determined timing signals (or sense amplifier control signals $\phi_{pa1}$ and $\phi_{pa2}$ (as will be described hereinafter). One unit circuit of the sense amplifier SA1 has its input/output terminals coupled, as shown, through the switch MOSFETs Q3 and Q4, respectively, to a pair of parallel-arranged complementary data lines $\overline{DL0L}$ and $\overline{DL0L}$ at the side of the memory array M1L and through switch MOSFETs Q19 and Q20, respectively, to a pair of parallel-arranged complementary data lines DL0R and the $\overline{DL0R}$ at the side of the memory array M1R. As is apparent from description thus far made, the numbers of the memory cells coupled to the complementary data lines DL0L to DL0R, are made equal to each other so as to enhance the detecting accuracy. Each dummy cell DC is coupled to a pair of input/output nodes of the unit circuit of the sense amplifier SA1.

In the aforementioned addressing, when the memory cell MC coupled to one of the paired complementary data lines of the memory array M1L or M1R is selected, one of the paired dummy word lines DWL and $\overline{DWL}$ is selected so that the dummy cell DC coupled to one of the paired input/output nodes of the unit circuit of the sense amplifier SA1 is coupled to one data line through the switch MOSFET.

The sense amplifier SA1 has its unit circuit composed of the paired MOSFETs Q1 and Q2, which are cross-connected, as has been described hereinbefore, and differentially amplifies the small signal, which appears between the complementary data lines, by the positive feedback actions of those MOSFETs. These positive feedback actions are started when a MOSFET Q27 is turned on by the timing signal $\phi_{pa1}$. The MOSFET Q27 is made to exhibit a relatively small conductance when it is rendered conductive. When the operations of the sense amplifier SA1 are started by the timing signal $\phi_{pa1}$, the potential difference applied in advance between the complementary data lines by the addressing is amplified. In other words, the higher data line potential is dropped at a slow speed, whereas the lower one is dropped at a high speed. Moreover, a MOSFET Q28 is rendered conductive in response to the timing signal $\phi_{pa2}$ which is generated at a timing when the potential difference is increased to some extent. The MOSFET Q28 is made to have a relatively large conductance when it is rendered conductive. The lower data line potential is abruptly dropped by starting the conduction of the MOSFET Q28. By thus conducting the operations of the sense amplifier SA1 at the two separate stages, the aforementioned higher potential is prevented from substantially dropping. When the lower potential thus drops to a level lower than the threshold voltage of the cross-coupled MOSFET, the positive feedback operation is ended, and the higher potential drops to a potential which is lower than the supply voltage Vcc and higher than the above threshold voltage, whereas the lower potential finally reaches ground potential (i.e., 0 V).

Upon this addressing, the stored data of the memory cell MC, which were once ready to be lost, are recovered as a result that the high- or low-level potential generated by that sensing operation being written in the memory cell MC. If the high level drops more than a predetermined extent with respect to the supply voltage Vcc as above, however, the repetitions of several times of the reading and rewriting operations will cause the erroneous operation that the high level may be written as the logic value 3∂0". In order to prevent this erroneous operation, therefore, there is provided the active restore circuit AR. This active restore circuit AR has an operation to selectively boost the high-level signal only to the potential of the supply voltage Vcc without adversely affecting the low-level signal.

The active restore circuit AR is constructed of unit circuits UAR0 to UAR3 which are coupled to a pair of input/output nodes of each unit sense amplifier. The unit circuit, e.g., UAR0 is composed, as shown in FIG.

5, of MOSFETs Q100 and Q101 which are connected between respective data lines DL0 and $\overline{DL0}$ and the supply terminal of the circuit, transmission gates MOSFETs Q102 and Q103 which are connected, respectively, between the data line $\overline{DL0}$ the MOSFET Q100 and between the data line DL0 and the MOSFET Q101, and boot strap capacitors CB1 and CB2. These boot strap capacitors CB1 and CB2 are made of MOS capacitors and operate substantially as variable-capacitance elements. The transmission gates MOSFETs Q102 and Q103 are rendered conductive after the amplification of the sense amplifier SA1 is executed in response to a timing signal $\phi_{ar0}$ and before a timing signal $\phi_{ar1}$ for boot strap is generated. The timing signal $\phi_{ar1}$ is set in advance at the low level and then at the high level.

The precharge circuit PC is constructed of unit circuits which are coupled to the input/output nodes of the sense amplifier SA1, respectively. Each of the unit circuits constructing the precharge circuit is composed, as shown in FIG. 4A, of precharge MOSFETs QP1 and QP2 which are connected between the respective complementary data lines and the supply terminal Vcc of the circuit, although not especially limitative thereto. The timing signal $\phi_{pc}$ for controlling the conductions of the precharge MOSFETs QP1 and QP2 is set at the high level for the non-access period of the RAM, i.e., while the $\overline{RAS}$ signal is at the high level. As a result, the respective complementary data lines are precharged at the high level near the level of the supply voltage Vcc. The precharging timing signal $\phi_{pc}$ is dropped to the low level in response to, the start of the access of the RAM. The unit circuit may include an equalizing MOSFET for short-circuiting the complementary data lines in response to the precharging timing signal $\phi_{pc}$.

As shown in FIG. 4A, the input/output nodes of one of the unit circuits constructing the sense amplifier SA1 are connected with a pair of common complementary data lines CD1 and $\overline{CD1}$ through the MOSFETs Q19 and Q20 which compose the column switch circuit CW1L, and the input/output nodes of another unit circuit adjoining the former one is connected through MOSFETs Q21 and Q22 with common complementary data lines CD2 and $\overline{CD2}$. The input/output nodes of the remaining unit circuits are connected through line MOSFETs Q23 and Q24, and Q25 and Q26 with their paired common complementary data lines CD1 and $\overline{CD1}$, and CD2 and $\overline{CD2}$.

By thus providing the two sets of common complementary data lines CD1 and $\overline{CD1}$, and CD2 and $\overline{CD2}$, the gates, of the MOSFETs Q19 to Q22 of the column switch are coupled in common. These common gates are fed with the data line selecting signal Y1 which is generated by the unit circuits constructing, the column address decoder C-DCR1. According to this construction, the unit circuits constructing the column address decoder C-DCR1 can be laid out with the pitch of the totally four data lines, as has been described hereinbefore, and no spare space is left on the semiconductor substrate by making the pitches of the two coextensive.

The switch circuit SW1L is composed, as shown in FIG. 4A, of switch MOSFETs Q3 to Q10 which are connected between the respective data lines DL0L to DL3L of the memory array M1L arranged at the lefthand side of the same Figure and a pair of the input/output nodes of the sense amplifier SA1. Of those MOSFETs Q3 to Q10, the MOSFETs Q3, Q5, Q7 and Q9 disposed at the side of the one-side data lines DL0L to DL3L have their gates shared among them and fed with a timing signal SHL1, and the MOSFETs Q4, Q6, Q8 and Q10 disposed at the side of the other data lines $\overline{DL0L}$ to $\overline{DL3L}$ have their gates shared among them and fed with a timing signal SHL2.

The switch circuit SW1R is composed, as shown in FIG. 4B, of switch MOSFETs Q11 to Q18 which are connected between the respective data lines DL0R to DL3R of the memory array M1R arranged at the right-hand side of the same Figure and a pair of the input/output nodes of the sense amplifier SA1. Of those MOSFETs Q11 to Q18, the MOSFETs Q11, Q13, Q15 and Q17 disposed at the side of the one-side data lines $\overline{DL0R}$ to $\overline{DL3R}$ have their common gates fed with a timing signal SHR1, and the MOSFETs Q12, Q14, Q16 and Q18 disposed at the side of the other data lines $\overline{DL0R}$ to $\overline{DL3R}$ have their common gates shared among them and fed with a timing signal SHR2. By combining the timing signals SHL1 and SHL2, and SHR1 and SHR2 to be fed to the gates of those switch MOSFETs Q3 to Q10 and Q11 to Q18, the amplifications of the read signals from the selected memory arrays are accomplished, and the reference voltage Vref necessary for the operations is generated, as will be described in the following.

Figure 6:
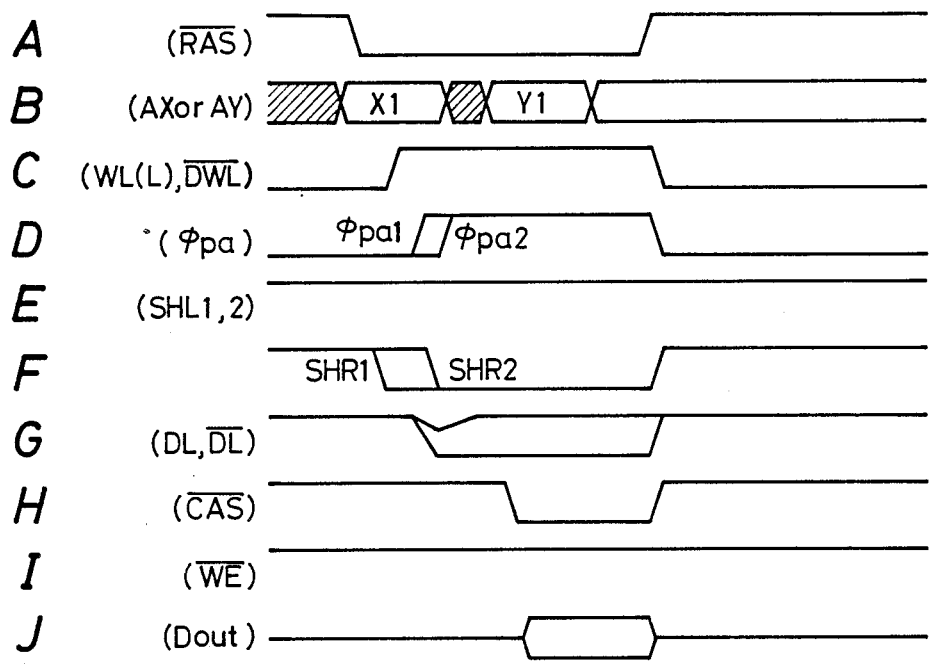
FIG. 6A-L are charts showing the operating waveforms of the RAM of FIG. 3.

FIG. 6 is a timing chart for explaining one example of the reading operations of the circuit according to the present embodiment.

In the stand-by state in which a column address strobe signal $\overline{RAS}$ and a column address strobe signal $\overline{CAS}$ are at the high level, as shown at A and H in FIG. 6, all the timing signals SHL1 and SHL2, and SHR1 and SHR2 are set at the high level, as shown at E and F in FIG. 6. As a result, all the switch MOSFETs Q3 to Q18 are rendered conductive. All the data lines of each memory array are precharged by the precharge circuit PC to the high level substantially equal to the supply voltage Vcc. In this stand-by state, the word line selecting timing signal is held at the reset level of the low level, and the respective word lines of each memory array are held at the non-selective low level. The capacitors of each dummy cell are held, in the discharged, i.e., reset state as a result of the MOSFET Qd being turned on by a timing signal $\phi_d$.

The access to the RAM is started when the row address strobe signal $\overline{RAS}$ is dropped to the low level, as shown at A in FIG. 6. In synchronism with the access start of the RAM, the precharging timing signal $\phi_{pc}$ is dropped to the low level so that the precharge circuit PC is rendered inoperative.

In response to the timing signals which are generated by the timing generator TG, the address buffer ADB of FIG. 3 takes in a row address signal X1 the which is fed from an external terminal. The word line selecting timing signal (not illustrated), which is reset in advance at the low level for the stand-by period of the RAM, is raised to the high level after the operations of the address buffer ADB. The row address decoders R-DCR1L to R-DCR2R are operated to decode the row address signal X1 when the respective word line selecting timing signals are set at the high level. Thus, as shown at C in FIG. 6, there are generated the selecting signals for selecting one word line and the dummy word line corresponding to the former.

In these selecting operations, when the memory cells MC coupled to the data lines DL0L, DL1L, DL2L and so on (which will be called "upper data lines" whereas the data lines such as the data lines $\overline{DL0L}$ and $\overline{DL1L}$ will be called "lower data lines") of the lefthand memory array M1L, for example, are selected, the timing signals SHL1 and SHL1 for controlling the switch circuit SW1L between the memory array M1L and the sense amplifier SA1 are held at the high level, as shown at E in FIG. 6. At this time, moreover, the timing signal SHR1 is first dropped to the low level, as shown at F in FIG. 6, before that word line and the dummy word line $\overline{DWL}$ are made to take the high level. According with this, the switch MOSFETs Q11, Q13, Q15, Q17 and so on, which are provided between the one-side complementary data lines DL0R to DL3R of the righthand side memory array M1R, i.e., between the upper data lines and the respective input/output nodes of the sense amplifier SA1, are turned off. Thus, when the one word line WL of the lefthand memory M1L and the dummy word line $\overline{DWL}$ are caused to take the high selection level, the respective data lines, to which are coupled the memory cells of the lefthand memory array M1L to be selected, are isolated from the corresponding data lines of the memory array M1R before starting of the memory cell selection. In other words, the respective data lines coupled to the memory cells to be selected are caused to have their respective data line capacitances reduced substantially. As a result, the potential changes, i.e., the data signals to be imparted to the respective data lines by the respective memory cells MC selected are set at relatively high levels. On the contrary, the remaining data lines (i.e., the lower data lines) of the complementary data lines of the memory array M1L are coupled to the corresponding data lines of the righthand memory array M1R because the switch MOSFETs Q4 and Q12 are rendered conductive. As a result, the data line stray capacitance of the dummy cell to be selected is caused to take a value substantially equal to the value of the summation of the respective stray capacitances existing in the data lines of the left and right memory arrays M1L and M1R, i.e., an about twice capacitance value such as Co+Co (=2Co). As a result, the ratio of the stray capacitances to be charge-coupled takes the value of one half. Even if the capacitors Cs and Cd are made to have an equal capacitance, it is possible to generate the reference voltage Vref having a substantially intermediate level between the read high and low levels. The generation of the reference potential Vref in this way will be easily understood. The ratio of the capacitance of the full-size dummy cell to the summation of the data line capacitances of the two data lines becomes equal to the ratio of the value of the stray capacitance of one data line to the capacitance of the capacitor Cd of the half-size dummy cells.

The timing signal $\phi_{pal}$ is made to take the high level after the word lines and the dummy word lines are caused to take selecting level, as shown at D in FIG. 6. According with this high level of the signal $\phi_{pal}$, the amplifying operations of the sense amplifiers SA1 and SA2 are started. The level difference given in advance between the respective complementary data lines of the memory array M1L is amplified by the sense amplifier SA1, as shown at G in FIG. 6.

Although not limited thereto, the timing signal SHR2 is dropped to the low level in substantial synchronism with the timing at which the timing signal $\phi_{pal}$ is raised to the high level as shown at F of FIG. 6. As a result, the switch MOSFETs Q12, Q14, Q18 etc. for coupling the data lines of the memory array M1R which are not coupled to the sense amplifier SA1 are turned off. As a result, in the amplification of the sense amplifier SA1, the load capacitors to be coupled to the paired respective input/output nodes of the respective unit circuits of the sense amplifier SA1 are balanced, and the reference voltage Vref is promptly lowered to the low level, when the data signal at the high level is to be read out, so that the aforementioned positive feedback amplifications can be conducted at a high speed.

In the case when the memory cells coupled to the lower data lines of the lefthand memory array M1L are to be subjected to the reading operations, the timing signal SHR2 is first caused to have the low level, and then the timing signal SHR1 is caused to have the low level in synchronism with the operation timing of the sense amplifier SA1. In the case when the righthand memory array M1R is selected so that the data are read out from the memory array M1R, on the other hand, the timing signals SHR1 and SHR2 are left at the high level, whereas the timing signals SHL1 and SHL2 are respectively dropped to the low level with the time difference according to their selected states like the above operations. This similarly applies to the selecting operations of the paired memory arrays M2L and M2R which are arranged at the righthand side of FIG. 3.

Next, when the column address strobe signal $\overline{CAS}$ is dropped to the selection level of the low level, as shown at H in FIG. 6, the timing generator TG first generates the timing signals for the address buffer ADB. As a result, the address buffer ADB takes as a column address signal Y1 the address signals fed from its external terminal and outputs the internal complementary address signals corresponding to those address signals.

Next, the data line selecting timing signals (not illustrated) are outputted from the timing generator TG. The column address decoders C-DCR1 and C-DCR2 are operated in response to the data line selecting timing signals and decode the internal complementary address signals to generate the data line selecting signals. In response to the data line selecting signals outputted from the column address decoder C-DCR1, the four pairs of the complementary data lines are selected from the memory arrays M1L to M2R and are connected with the corresponding common complementary data lines, respectively. In response to the data line selecting signals outputted from the column address decoder C-DCR2, moreover, a pair of the common complementary data lines are selected from the four pairs of the common complementary data lines.

If the write enable signal $\overline{WE}$ is set at the high read level, as shown at I in FIG. 6, the timing signal (not illustrated) for rendering the data output circuit DOB operative is outputted from the timing generator TG after the data line selecting timing signals. As a result, the signals of the complementary data lines selected on the basis of the output of the decoder C-DCR2 are amplified and fed out to the external terminal Dout.

When the write enable signal $\overline{WE}$ is dropped to the low write level, a timing signal for operating the data input circuit DIB is responsively generated from the timing generator TG. In this case, the write data signal of the external terminal Din is fed to the complementary data lines of one of the four memory arrays through the data input circuit DIB, any one of the column switch circuits SW2L, CW2R, CW1L and CW1R, and any one of the switch circuits SW1L to SW2R.

With the construction described above, the so-called "full-size cells" can be used as the dummy cells. In the case of the present embodiment, the full-size dummy cells are not stored with the reference voltage, which is susceptible to variation due to the fluctuations of the supply voltage, such as the voltage generated by a voltage divider or the like but the earth potential of the circuit. Therefore, the stable read reference voltage can be generated even for the fluctuations of the supply voltage. Since the full-size dummy cells can be used, moreover, the highly accurate reference voltage can be generated even both with a limitation upon the fine pattern working accuracy and in case grooved capacitors are used. It is possible to achieve a dynamic RAM having a large storage capacity such as 1 megabit.

In the present embodiment, moreover, the complementary data lines arranged at the right and left sides of the sense amplifier SA1 are short-circuited to each other so that an RAM resisting to the software error due to the α particles can be fabricated.

Specifically, the complementary data lines are brought in their floating states in response to the inoperative state of the precharge circuit PC, which is initiated at the start of the access of the RAM. The complementary data lines in the floating states have their respective levels determined exclusively in dependence upon the charges held in the respective capacitors so that they become susceptible to the influence by α particles. In case one data line is exposed to α particles, it has its level dropped by the leakage current which is caused by the α particles. When the level of that data line is varied, the level difference between the complementary data lines is varied in an undesirable manner. The influence due to α particles is especially high when the levels between the complementary data lines are not sufficiently high, as at the start of the sensing operations of the data signals.

Figure 7A:
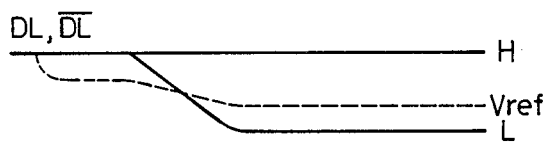
FIGS. 7A and 7B are charts showing the potential waveforms of the data lines, respectively.

FIG. 7A shows the voltage waveforms of the complementary data lines when the reference potential si changed by α particles. One of data line (which will be called a "read data line") of the complementary data lines which is to be fed with the read data signals from the memory cells is caused to take the high level H or the low level L, as indicated by a solid curve in FIG. 7A, when the selection of the memory cells is started. The other data line (which will be called a "reference data line") of the complementary data lines, which is to be supplied with the reference potential, is caused to take the reference potential Vref as a result that the dummy cell being selected. In this case, the potential of the reference data line is dropped by the influences of the α particles, as shown by a broken curve in FIG. 7A. As a result, the reference potential to be applied to the reference data line when the dummy cell is selected is dropped to a lower level than that which is established in the case of no influence by the α particles. As a result of the reduction in the reference voltage Vref, the level difference between the low level L of the read data line and the reference potential Vref is undesirably reduced. In accordance with the present embodiment, however, the reference data line is enabled to have substantially twice the data line capacitance as a result of it being coupled to the corresponding data line of the memory array which is left unselected, as has been described hereinbefore. Therefore, the fluctuations of the reference potential Vref are suppressed to a narrow range even if the leakage current is generated by α particles. By these suppressed fluctuations of the reference voltage Vref, the reduction in the level difference between the complementary data lines in the reading operation of the low level is made small.

Figure 7B:
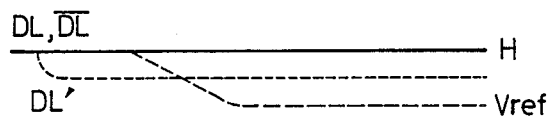

FIG. 7B shows the voltage waveforms in the case where the levels of the data lines to be fed with the read data at the high level are adversely affected by α particles.

In the read data line, specifically, the charges stored in the capacitors Co thereof are reduced as a result of the data line being exposed to α particles. As a result, the level of the read data line is changed from a solid curve to a broken curve of FIG. 7B. In other words, such a level of the read data line as has been dropped is presented, substantially as it is, as the high read level.

Incidentally, it is desirable that the capacitance of the capacitor Cd forming a part of the dummy cell is slightly larger than that of the capacitor Cs of the memory cell by taking the following points into consideration. Specifically, in the case when the low level L is to be read out and in the case when the level of the read data is adversely affected by α particles, the reduction in the level margin for the reference as it is the read level margin for the reference voltage Vref. It is desirable that the reference voltage Vref be set at an approximately an intermediate level between such a high level H' of the read data line as is dropped by the α particles and the low level of the read data line in the case of no influence by the α particles. In other words, it is desirable that the capacitor Cd of the dummy cells be set at a value to impart a suitable offset to the reference voltage Vref by imagining the worst case by α particles, i.e, the worst case of the level difference between the complementary data lines, which is caused by the α particles for the short time period after the respective data lines are brought into their floating states and before the sense amplifier is brought into its operative state.

The α particles are naturally radiated upon the capacitors of the memory cells or the dummy cells because they are substantially radiated at random upon the semiconductor substrate. In this case the probability of irradiating the capacitors with α particles is negligible because the number of the dummy cells provided is small. On the contrary, the capacitors of the memory cells have their stored charges lost mostly when they are exposed to α particles, because they have a remarkably small capacitance. In this case, measures can be prepared by adopting the well-known error correcting construction using both a parity bit and an error correcting circuit, for example.

Figure 8:
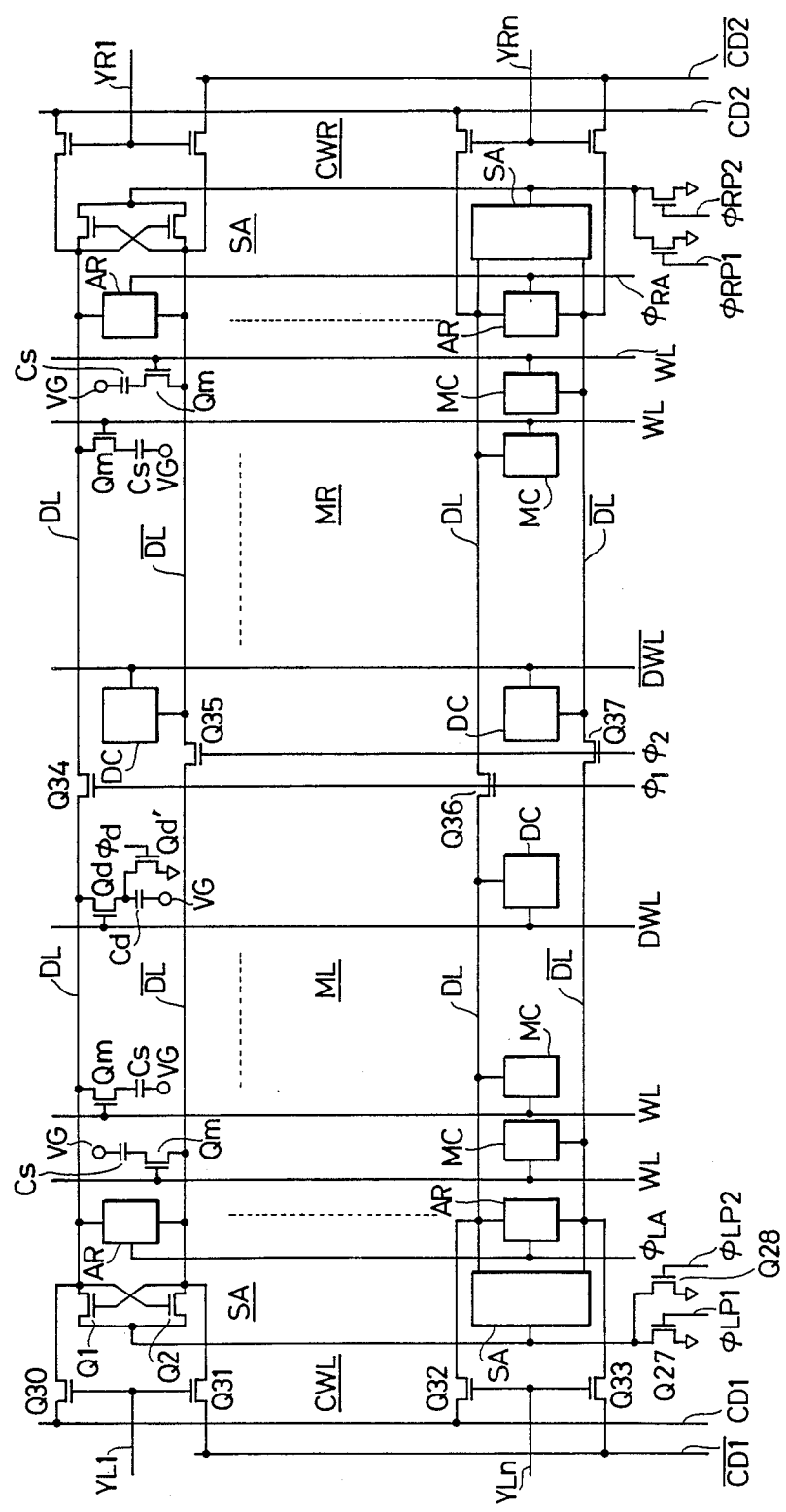
FIG. 8 is a circuit diagram showing a dynamic RAM according to a third embodiment.

FIG. 8 is a circuit diagram shown another embodiment of the present invention.

In place of the shared sense amplifier construction of the second embodiment, the circuit of this embodiment is equipped with switch MOSFETs which are provided between the corresponding data lines of two memory arrays ML and MR having sense amplifiers, respectively. Incidentally, precharge circuits are omitted from FIG. 8 because they have no direct relationship with the gist of the present invention, which will be described in the following.

The description will be first made upon the memory array ML which is arranged at the lefthand side of the same Figure. A pair of complementary data lines DL and $\overline{DL}$ arranged in parallel are directly coupled to the input/output nodes of a sense amplifier SA which is composed of MOSFETs Q1 and Q2 like the foregoing embodiments. On the other hand, those complementary data lines DL and $\overline{DL}$ are equipped with an active restore circuit AR. The construction of the memory cells to be coupled to those complementary data lines DL and $\overline{DL}$ is similar to that of the memory cells MC shown in FIGS. 4A and 4B, and its description is omitted here.

MOSFETs Q27 and Q28 for rendering the sense amplifier SA operative have their gates fed with timing signals φLP1 and φLP2 which are generated like the aforementioned embodiment when that memory array ML is brought into its selected state. Between the respective data lines and common data lines CL1 and CD1 of the memory array ML, there are connected switch MOSFETs Q30 to Q33 which constitute a column switch circuit CWL. According with this, a pair of the complementary data lines, which are made to correspond to selecting signals YL1 and YLn generated by a column address decoder (not illustrated), are coupled to the common complementary data lines CD1 and $\overline{CD1}$.

The memory array MR at the righthand side of FIG. 8 is equipped with data lines which are made to correspond one-to-one to the respective data lines of the memory array ML. That memory array MR is constructed of sense amplifiers SA, which are similar to those of the aforementioned left memory array ML, and a column switch circuit CWR. Operation timing signals φRP1 and φRP2 of the sense amplifier SA are generated when memory array MR is brought into its selected state.

Each full-size dummy cell DC is located at one of the corresponding data lines of the memory arrays ML and MR. Although not limited thereto, as shown, the lower data line $\overline{DL}$ of the righthand memory array MR is equipped with the dummy cell DC in a manner to correspond to the construction in which the upper data line DL of the two complementary data lines DL and $\overline{DL}$ of the left memory array ML is equipped with the dummy cell DC. The detailed descriptions of those dummy cells are omitted here because they are similar to the aforementioned ones shown in FIG. 4B.

Moreover, switch MOSFETs Q34 to Q37 are provided, respectively, between the corresponding data lines of the left and right memory arrays ML and MR. The switch MOSFETs Q34, W36 and so on, which are provided between the respective upper data lines DL of the memory arrays ML and MR, have their gates connected in common and fed with a timing signal φ1. Moreover, the switch MOSFETs Q35 and Q37 provided between the lower data lines DL have their gates connected in common and fed with a timing signal φ2.

The circuit according to the present embodiment can take the following two constructions in accordance with the facts that the timings of the timing signals φ1, φ2, φLP1, φLP2, φRP1 and φRP2 generated from not-shown timing generator are suitably changed, as will become apparent from the following description, and that the not-shown row address decoders corresponding to the memory arrays ML and MR, respectively, are suitably modified.

In the first construction, the lefthand memory array ML and the righthand memory array MR are alternatively selected. Specifically, in order for the row address decoders (not illustrated) to correspond to the two memory arrays ML and MR, they are so constructed as to select one of the plural word lines of the two memory arrays ML and MR on the basis of the row address signals. The common data lines $\overline{CD1}$ and CD1 and the common data lines $\overline{CD2}$ and CD2 are selected, by a second column switch circuit (not illustrated) similar to that of the foregoing embodiment.

The operations of the circuit in the case of this first construction are made substantially similar to those of the circuits of the foregoing embodiments of FIGS. 4A and 4B. The difference resides exclusively in that only such ones of the sense amplifiers SA and active restore circuits AR of the memory arrays ML and MR, respectively, as correspond to the memory array selected are brought into their operative states.

Figure 9:
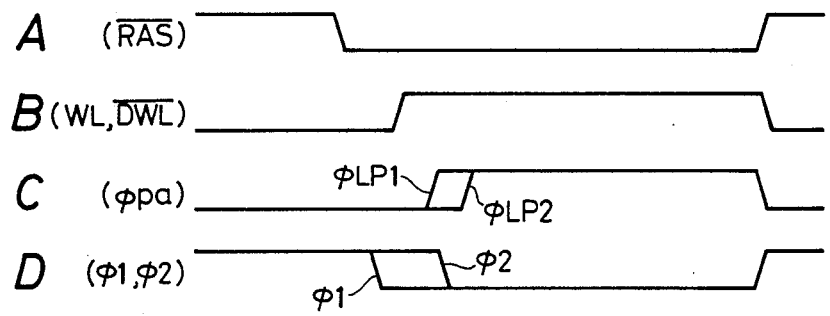
FIGS. 9A-D and 10A-D, are charts showing the operating waveforms of the RAM of FIG. 8, respectively.

Specifically, in the case, for example, when the memory cell coupled to the upper data line DL of the lefthand memory array ML is to be selected, the timing signal φ1 is caused to take the low level, a shown at D in FIG. 9, before one word line of the memory array ML is brought into its selected state, so that the switch MOSFETs Q34, Q36 and so on are first rendered inconductive.

As a result, when such a memory cell of the lefthand memory array ML as is coupled to the upper data line DL is to be selected, that data line DL is isolated from the corresponding upper data line of the righthand memory array MR. In this case, the dummy word line $\overline{DWL}$ is caused to take the high selection level as the memory cell coupled to the upper data line is selected. In response to this, the dummy cell coupled to the lower data line of the righthand memory array MR is selected. The timing signal φ2 is still left at the high level even if the dummy cell is selected, as shown at D in FIG. 9. As a result, the lower data lines $\overline{DL}$ and $\overline{DL}$ of the left and right memory arrays ML and MR are caused to take the reference voltage Vref similar to the aforementioned one by the full-size dummy cell because they remain coupled to each other like the above embodiments. The timing signal φ2 is caused to take the low level, as shown at D in FIG. 9 like the above embodiments in synchronism with the timing at which the timing signal φLP is caused to take the high level, as shown at C in FIG. 9. As a result, the switch MOSFETs Q35, Q37 and so on are rendered to an off state so that the data lines of the right and left memory arrays are isolated.

In response to timing signal φLP1 and the timing signal φLP2 generated subsequent to the former one, the sense amplifiers SA of the lefthand memory array ML are operated altogether to amplify the read signals coming from the memory cells selected. At a suitable timing after the sense amplifiers SA are operated, data line selecting signals YL1 to YLn are generated so that a pair of the complementary data lines of the memory array ML are selected.

According to the second construction, the two memory arrays ML and MR are simultaneously selected as a result that the row address decoder (not illustrated) is made to have a suitable construction. The respective word lines of the memory array ML are made to correspond one-to-one to the respective word lines of the memory array MR. The corresponding word lines of the memory arrays ML and MR are coupled to the memory cells which in turn are coupled to the corresponding data lines of the respective memory arrays ML and MR. The timing signals φLP1 and φLP2, and φRP1 and φRP2 for controlling the sense amplifiers coupled to the memory arrays ML and MR, respectively, are made identical to each other, as is different from the aforementioned first construction. The timing signals φ1 and φ2 for controlling the switch circuits (Q34 to Q37) connected between the memory arrays ML and MR have their timings changed from those of the foregoing first construction, as will become apparent from the following description.

The circuit made to have the second construction has the following operations.

Figure 10:
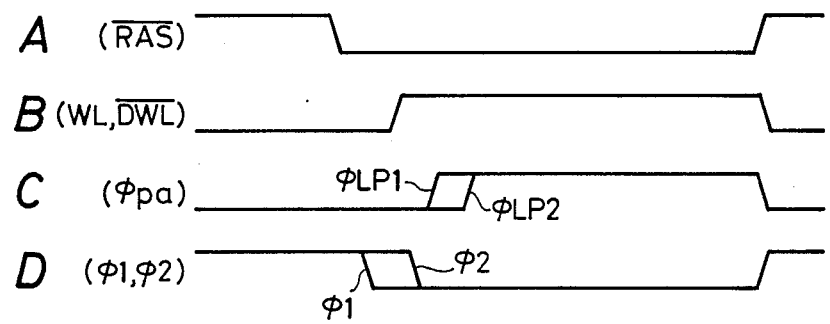

If the $\overline{RAS}$ signal is set at the high level, as shown at A in FIG. 10, the timing signals φ1 and φ2 are responsively caused to take the high level, as shown at D in FIG. 10. According with this, the switch circuit is turned on so that the data lines corresponding to the memory arrays ML and MR, respectively, are short-circuited to each other. The respective data lines at this time are set at the precharge level substantially equal to the supply voltage Vcc of the circuit.

When the $\overline{RAS}$ signal is caused to take the low level, the access of the RAM is started.

Of the timing signals $\phi 1$ and $\phi 2$, the timing signal for controlling the MOSFET coupled to the data line to be used as the read data line is caused to take the low level before the selection of the word lines is started. For example, if the upper data line DL of the complementary data lines of the respective memory arrays ML and MR is used as the read data line, the timing signal $\phi 1$ is caused to take the low level, as shown at D in FIG. 10. As a result, the upper data lines of the respective memory arrays ML and MR are electrically isolated from each other.

After the timing signal $\phi 1$ or $\phi 2$ is caused to take the low level, the corresponding word lines of the memory arrays ML and MR are selected one by one. In synchronism with the word line selection, one of the dummy word lines DWL and $\overline{DWL}$ is selected. As a result, the respective read data lines of the memory arrays ML and MR are fed with the data signals from the memory cells, respectively, and the respective reference data lines are supplied with the reference potential.

Of the timing signals $\phi 1$ and $\phi 2$, the timing signal for controlling the MOSFET coupled to the reference data line is caused to take the low level for the time period after the dummy word lines are selected and before the timing signals for the sense amplifier control are generated. As a result, the reference data lines of the memory arrays ML and MR are electrically isolated from each other.

After that, the sense amplifiers SA coupled to the memory arrays ML and MR are operated as a result that the timing signals $\phi LP1$, $\phi RP1$, $\phi LP2$ and $\phi RP2$ are generated, as shown at C in FIG. 10.

After the operations of the sense amplifier SA, the data line selecting signals are generated by the not-shown column address decoder so that the complementary data lines of each of the memory arrays ML and MR are coupled to the common data lines $\overline{CD1}$, CD1, $\overline{CD2}$ and CD2.

In the present embodiment, the sense amplifiers SA and the data lines are directly connected so that the operations of the sense amplifiers SA can be speeded up.

In this embodiment the read reference voltage can be generated by the full-size dummy cells. Since the stray capacitances of the data lines can be temporarily enlarged, moreover, the resistance to software errors due to the $\alpha$ particles can be enhanced like the above embodiments.

Figure 11:
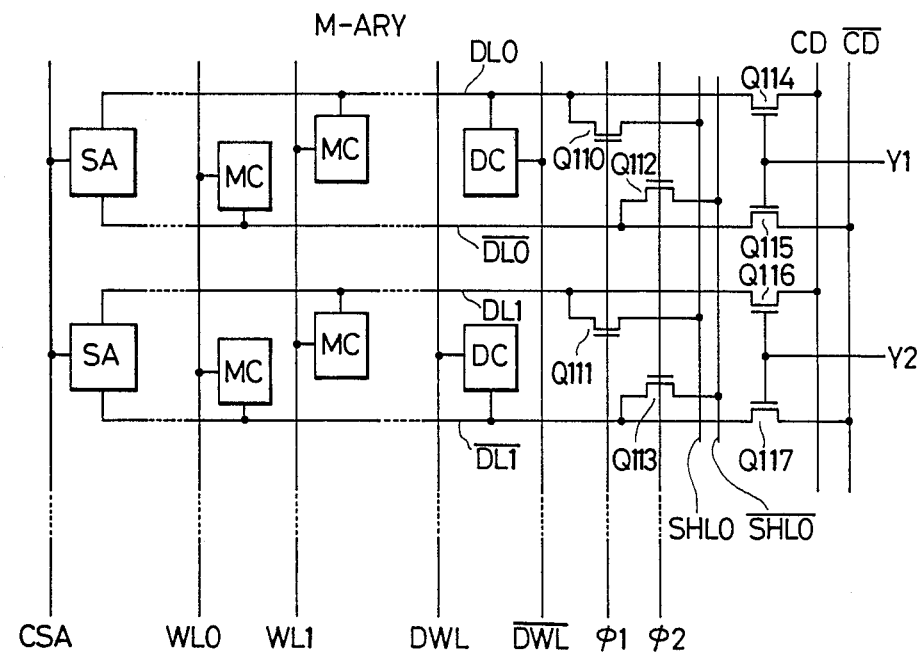
FIGS. 11 and 12 are circuit diagrams of dynamic RAMs according to fourth and fifth embodiments.

FIG. 11 is a circuit diagram showing the dynamic RAM according to a further embodiment of the present invention.

In accordance with this embodiment, between complementary data lines DL0 and $\overline{DL0}$ and respectively adjoining complementary data lines DL1 and $\overline{DL1}$ of one memory array M-ARY, there are provided MOSFETs Q110 to Q113 which are switched by timing signals $\phi 1$ and $\phi 2$, respectively. Although not especially limitative, a wiring SHL0 for connecting the MOSFETs Q110 and Q111 in series is extended across the data lines DL0 and $\overline{DL1}$, too, so as to improve better the capacitance balance of the respective data lines. Likewise, a wiring SHL0 also extended across the data lines DL0 and $\overline{DL1}$. Incidentally, two pairs of the MOSFETs Q110 and Q111, and Q112 and Q113 may be respectively replaced by one MOSFET as a result that they are connected in series with each other and are simultaneously turned on or off. Full-size dummy cells are coupled to the data lines DL0 and $\overline{DL1}$, respectively. Between the respective data lines and common data lines CD and $\overline{CD}$, there are connected MOSFETs Q114 to Q117 which compose a column switch circuit. In FIG. 11, an active restore circuit and a precharge circuit, which are to be coupled to the complementary data lines, respectively, are not illustrated so as to overly complicate the drawings.

The operations of the circuit of the present embodiments are made substantially identical to those of the foregoing embodiment of FIG. 8.

Specifically, one of the timing signals $\phi 1$ and $\phi 2$ is caused in advance to take the low level prior to the start of the selection of the word lines, whereas the other is caused to take the low level after the start of the selection of the word lines and before the start of the operations of the sense amplifiers SA. As a result, the two series-connected MOSFETs connected between the two data lines acting as the read data lines are turned off before the start of the selection of the word lines, whereas the two series-connected MOSFETs connected between the two data lines acting as the reference data lines are turned off after the reference potential is generated by the dummy cells.

The fluctuations of the reference potential by $\alpha$ particles are reduced because the two reference data lines are short-circuited to each other immediately before the start of the operations of the sense amplifiers SA.

Figure 12:
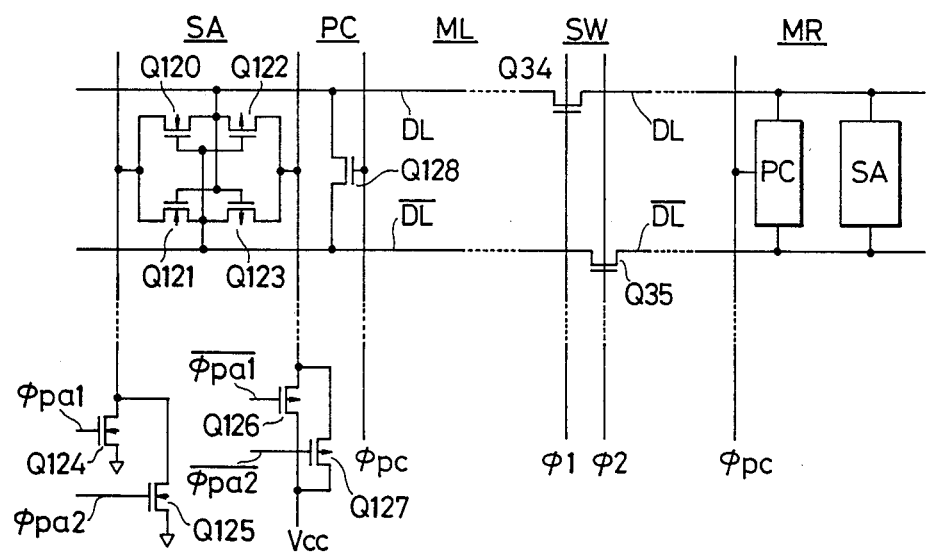

FIG. 12 is a circuit diagram showing a dynamic RAM according to a further embodiment of the present invention.

The RAM of this embodiment is made to have the half-precharge construction and is not equipped with any dummy cells.

The RAM of this embodiment is equipped like the embodiment of FIG. 8 with the switch circuit SW which is composed of MOSFETs Q34 and Q35 and which is connected between data lines corresponding to the memory arrays ML and MR, respectively.

A sense amplifier SA, a precharge circuit PC and memory cells (not illustrated) are coupled to the respective complementary data lines DL and $\overline{DL}$ of the memory arrays ML and MR, respectively. To the respective data lines, on the other hand, there are coupled a column switch circuits which are shown in FIG. 8.

The precharge circuit PC is composed, as shown, of an N-channel MOSFET Q128 which is connected between the complementary data lines DL and $\overline{DL}$.

The sense amplifier SA is equipped with N-channel MOSFETs Q120 and Q121 and P-channel MOSFETs Q122 and Q123 which constitute together a CMOS latch circuit. The sense amplifier SA is further equipped with power switch N-channel MOSFETs Q124 and Q125, which are connected between the common source of the MOSFETs Q120 and Q121 and the earth point of the circuit, and power switch P-channel MOSFETs Q126 and Q127 which are connected between the common source of the MOSFETs Q122 and Q123 and the supply voltage Vcc of the circuit. The MOSFETs Q124 and Q126 are simultaneously turned on or off in response to timing signals $\phi pa1$ and $\overline{\phi pa1}$ which are in opposite phases Likewise, the MOSFETs Q125 and Q127 are also simultaneously turned on or off in response to timing signals φpa2 and φ̄pa2.

In accordance with the present embodiment, the precharge levels of the respective complementary data lines DL and DL of the memory arrays ML and MR are set, as follows.

When the RAM is switched from its accessed state to its non-accessed state, the one word line (not illustrated) of each of the memory arrays ML and MR is set at the unselected low level, and the timing signals φpa1 and φpa2, and φ̄pa1 and φ̄pa2 are caused to take the low and high levels, respectively, as to turn off the power switch MOSFETs Q124 to Q127. Moreover, the precharging timing signal φpc is caused to take the high level.

As a result, the timing signal φpc is caused to take the high level and the precharge circuit PC is rendered operative. The precharge circuit PC redistributes the mutual charges of the complementary data lines DL and DL which are coupled thereto. As a result, in response to the previous amplifying operations of the sense amplifier SA, the complementary data lines DL and DL, which are respectively caused to take the high level substantially equal to the supply voltage Vcc and the low level substantially equal to the earth potential, are caused to take the precharge level substantially equal to Vcc/2. The precharge level of the complementary data lines DL and DL can be deemed as the reference potential in case the data signals are read out from the memory cells.

The operations of the circuit of the present embodiment are made substantially identical to those of the foregoing embodiment of FIG. 8 except the difference of the precharge levels. Therefore, the description of the circuit operations after other precharge operations are omitted.

According to the present invention, the following effects can be achieved.

(1) Of the corresponding data lines of a pair of the memory arrays, the data lines to which the dummy cells to be selected are coupled are short-circuited so that their stray capacitance can be made twice as large as that of the data lines to which the memory cells to be selected are coupled. This causes the reference voltage at a substantially intermediate level between the high and low read levels of the data lies to be generated by the full-size dummy cells.

(2) Since the full-size dummy cells are stored in advance with the ground potential of the circuit, there can be achieved an effect that it is possible to generate the read reference voltage which is stable even for the fluctuations of the supply voltage.

(3) Since the above effect (1) makes it possible to use the full-size dummy cells, there can be achieved an effect that the operating margin of the circuit can be enlarged even for the restrictions upon the working accuracy of the fine patterns and the adoption of grooved capacitors. This makes it possible to realize the dynamic RAM having the large storage capacity such as 1 megabit.

(4) The data lines can have their stray capacitances enlarged as a result of them being short-circuited to hold the precharge level. Since this makes it possible to reduce the level drop of the data lines due to α particles, there can be achieved an effect that the resistance to software errors can be enhanced.

(5) Since the level margin of the reference voltage for the drop at the high level side can be retained by imparting an offset to the low level side while imagining the worst case due to the influences of α particles, there can be achieved an effect that the resistance to software errors can be further enhanced in cooperation with the aforementioned effect (4).

(6) Since the memory cells and the dummy cells can be finely constructed by the multiplication of the above actions (1) to (5), there can be achieved an effect that the dynamic RAM can have a small chip size and enlarge its storage capacity.

Although the invention has been specifically described hereinbefore in connection with the embodiments thereof, it should not be limited to the foregoing embodiments and can be modified in various ways without departing the scope of the gist thereof.

The specific constructions of the memory arrays making up the dynamic RAM and the peripheral circuits of the same can take a variety of modes of embodiments. For example, the read reference voltage may be generated by using not only the full-size dummy cells, as has been described hereinbefore, but also full-size dummy cells which are precharged in advance to a voltage substantially half as high as the supply voltage. In this case, specifically, the full-size dummy cells are coupled, respectively, to the data lines of one memory array. Moreover, the switch MOSFETs as in the embodiment of FIG. 11 are connected between the alternate ones DL, DL, —, and so on (or DL, DL, —, and so on) of the complementary data lines. The data lines to be supplied with the reference potential by the full-size dummy cells, respectively, are short-circuited for the time period before the sense amplifier starts it operations. In this case, both the precharge levels of the respective data lines after the respective data lines are brought into their floating states and before the word lines and the dummy word lines are selected and the reference potentials of the respective reference data lines after the dummy word lines are selected and before the sense amplifier has its operations started are held by the respective stray capacitances which are enlarged by the connections of the data lines. As a result, the resistance to software errors can be enhanced like the above embodiments. Incidentally, in this case when full-size dummy cells of half-precharge are used, each two of the alternate ones of the complementary data liens, which are simultaneously short-circuited by the switch circuit, need not necessarily be paired. The number of the alternate data lines to be simultaneously short-circuited may be set at a suitable value. The dummy cells of half-precharge in this case can be replaced by the half-size dummy cells.

The embodiment of FIG. 11 can be modified to have such a dummy cellless construction as is embodied in FIG. 12. In this case, the sense amplifiers of FIG. 11 and the precharge circuits (not illustrated) are replaced by those of FIG. 12, for example, and the dummy cells are dispensed with. In this case, moreover, the number of the data lines to be short-circuited to each other in response to the timing signals φ1 and φ2 need not be two. The precharge level of each data line need not be Vcc/2. The precharge circuits may be made to have a construction, in which the respective data lines are coupled to a suitable potential source made of a voltage dividing circuit, in place of the construction in which the complementary data lines are simply short-circuited to each other.

The present invention can find its wide application to a memory such as the dynamic RAM which makes use of the read reference voltage. The dynamic RAM need not necessarily mean one independent device. For example, the RAM may be one which is formed on one semiconductor substrate together with a variety of circuits constructing a microcomputer system.

What is claimed is:

1. A dynamic RAM comprising:
   first and second data lines each having a plurality of memory cells coupled thereto which are disposed in a first memory array;
   a sense amplifier for differentially amplifying the difference between a reference level applied to one of said first and second data lines and a data signal level applied to the other of said first and second data lines by one of said memory cells; and
   a first switch circuit coupled to said one of said first and second data lines for electrically coupling an additional capacitor comprising a data line capacitance of a third data line, contained in a second memory array different from said first memory array, and having a plurality of memory cells coupled thereto to said one data line to make the data line capacitance of said one data line larger than that of said other data line.

2. A dynamic RAM according to claim 1 wherein said first switch circuit is made operative to enlarge the data line capacitance of said one data line at a time before at least said sense amplifier is operated.

3. A dynamic RAM according to claim 2 wherein each of said memory cells is composed of a data storing capacitor and a selecting MOSFET coupled to said data storing capacitor; and
   wherein said first switch circuit comprises a MOSFET.

4. A dynamic RAM according to claim 3 wherein each of said first to third data lines has a substantially equal data line capacitance.

5. A dynamic RAM comprising:
   first and second data lines constituting the data lines of a first memory array having a folded data line construction and which are to be paired and each having a plurality of memory cells coupled thereto;
   third and fourth data lines constituting the data lines of a second memory array having a folded data line construction and which are to be paired and each having a plurality of memory cells coupled thereto;
   an address circuit for selecting said plural memory cells;
   a first sense amplifier for amplifying the level between a reference level applied to one of said first and second data lines and a data signal level applied to the other of said first and second data lines by a selected memory cell;
   a second sense amplifier for amplifying the difference between a reference level applied to one of said third and fourth data lines and a data signal level applied to the other of said third and fourth data lines by a selected memory cell;
   a first switch circuit for coupling said first data line and said third data line to each other; and
   a second switch circuit for coupling said second data line and said fourth data line to each other.

6. A dynamic RAM according to claim 5 wherein said address circuit is constructed to select one of said plural memory cells coupled to said first to fourth data lines;
   wherein said first switch circuit is turned off to electrically isolate said first and third data lines from each other before the start of the selection of said memory cells when a data signal is applied to one of said first and third data lines; and
   wherein said second switch circuit is switched to electrically isolate said second data line and said fourth data line from each other before the start of the selection of said memory cells when a data signal is applied to one of said second data line and said fourth data lines.

7. A dynamic RAM according to claim 6, further comprising:
   a precharge circuit for causing said first to fourth data lines to take substantially equal precharge levels before the start of the selection of said memory cells;
   first to fourth dummy cells coupled to said first to fourth data lines, respectively, and having a capacitance substantially equal to the respective data holding capacitances of said memory cells; and
   wherein said address circuit is constructed to select either of said first or second dummy cells, which is coupled to said first or second data lines, when one of said memory cells coupled to said first or second data lines is to be selected, and to select either of said third or fourth dummy cell, which is coupled to said third or fourth data lines, when one of said memory cells coupled to said third and fourth data lines is to be selected.

8. A dynamic RAM comprising:
   a plurality of memory cells each including an address selecting MOSFET and a data storing capacitor;
   a dummy cell including a capacitor having a capacitance corresponding to said data storing capacitance;
   a pair of first and second data lines having substantially equal data line capacitances, one of said first and second data lines has a data signal applied thereto by a selected one of said plural memory cells whereas the other of said first and second data lines has a reference voltage applied thereto by said dummy cell;
   a sense amplifier for differentially amplifying the difference between the data signal on one of said first and second data lines and said reference voltage on the other of said first and second data lines;
   a third data line having a capacitance substantially equal to that of said other data line;
   switching means for electrically coupling said third data line to said other data line so that said reference voltage may be determined as a result of the charge distribution among the capacitor of said dummy cell, said other data line and said third data line; and
   wherein said third data line is provided in a memory array different from a memory array including said other data line.

9. A dynamic RAM according to claim 8 wherein said switching means is turned off at a time when said sense amplifier is rendered operative.

10. A dynamic RAM according to claim 8 wherein said dummy cell is coupled to said other data line.

11. A dynamic RAM according to claim 10 wherein said switching means is provided between the memory array including said other data line and the memory array including said third data line.

12. A dynamic RAM according to claim 11 wherein said switching means including a switch MOSFET for coupling said third data line to said other data line.

13. A dynamic RAM according to claim 12 wherein said switch MOSFET is turned off at a time when said sense amplifier is rendered operative.

* * * * *